(12) United States Patent
Manipatruni et al.

(10) Patent No.: US 11,581,417 B2
(45) Date of Patent: Feb. 14, 2023

(54) IMPROPER FERROELECTRIC ACTIVE AND PASSIVE DEVICES

(71) Applicant: Intel Corporation, Santa Clara, CA (US)

(72) Inventors: Sasikanth Manipatruni, Portland, OR (US); Uygar Avci, Portland, OR (US); Sou-Chi Chang, Portland, OR (US); Ian Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 980 days.

(21) Appl. No.: 16/130,903

(22) Filed: Sep. 13, 2018

(65) Prior Publication Data

US 2020/0091308 A1    Mar. 19, 2020

(51) Int. Cl.
| | | |
|---|---|---|
| *G11C 11/22* | (2006.01) | |
| *H01L 29/51* | (2006.01) | |
| *H01L 29/78* | (2006.01) | |
| *H01L 27/11585* | (2017.01) | |
| *H01L 27/11502* | (2017.01) | |

(52) U.S. Cl.
CPC .......... *H01L 29/516* (2013.01); *G11C 11/221* (2013.01); *G11C 11/223* (2013.01); *H01L 27/11502* (2013.01); *H01L 27/11585* (2013.01); *H01L 29/78391* (2014.09)

(58) Field of Classification Search
CPC ............ H01L 29/516; H01L 27/11502; H01L 27/11585; H01L 29/78391; H01L 27/11507; H01L 27/1159; H01L 28/55; G11C 11/221; G11C 11/223
USPC .................................. 257/295, 290; 365/145
See application file for complete search history.

(56) References Cited

U.S. PATENT DOCUMENTS

| | | | | |
|---|---|---|---|---|
| 5,478,610 A | * | 12/1995 | Desu ...................... | H01L 28/60 427/419.7 |
| 7,750,390 B2 | * | 7/2010 | Saito ....................... | G11C 11/16 257/314 |
| 9,299,485 B1 | * | 3/2016 | Katiyar ................... | H01F 1/407 |

(Continued)

FOREIGN PATENT DOCUMENTS

WO    WO-2020028670 A1 *  2/2020    ......... H01L 41/1871

OTHER PUBLICATIONS

Cheng et al., (Ba,Zr)TiO3 ferroelectric film with optimized performance and its preparing method, 2005, Tongji University, All pages. (Year: 2005).*

Charles S. Whitman, Estimating effective dielectric thickness for capacitors with extrinsic defects by a statistical method, 2007, RFMD, All pages. (Year: 2007).*

(Continued)

*Primary Examiner* — Michael T Tran
(74) *Attorney, Agent, or Firm* — Essential Patents Group, LLP

(57) ABSTRACT

A capacitor is provided which comprises: a first structure comprising metal; a second structure comprising metal; and a third structure between the first and second structures, wherein the third structure comprises an improper ferroelectric material. In some embodiments, a field effect transistor (FET) is provided which comprises: a substrate; a source and drain adjacent to the substrate; and a gate stack between the source and drain, wherein the gate stack includes: a dielectric; a first structure comprising improper ferroelectric material, wherein the first structure is adjacent to the dielectric; and a second structure comprising metal, wherein the second structure is adjacent to the first structure.

18 Claims, 20 Drawing Sheets

(56) References Cited

U.S. PATENT DOCUMENTS

| | | | | |
|---|---|---|---|---|
| 10,951,213 | B1* | 3/2021 | Manipatruni | H03K 19/20 |
| 2008/0099880 | A1* | 5/2008 | Cho | H01L 23/5223 |
| | | | | 257/532 |
| 2011/0315181 | A1* | 12/2011 | Erbil | H01L 37/02 |
| | | | | 136/224 |
| 2011/0316385 | A1* | 12/2011 | Erbil | H01L 37/02 |
| | | | | 310/306 |
| 2012/0019098 | A1* | 1/2012 | Erbil | H01L 37/02 |
| | | | | 310/306 |
| 2012/0031449 | A1* | 2/2012 | Erbil | H01L 35/30 |
| | | | | 136/200 |
| 2012/0048508 | A1* | 3/2012 | Erbil | H01L 37/02 |
| | | | | 165/60 |
| 2012/0069648 | A1* | 3/2012 | Kramer | G11C 11/1675 |
| | | | | 365/171 |
| 2015/0228321 | A1* | 8/2015 | Lee | G11C 11/1673 |
| | | | | 365/158 |
| 2018/0078898 | A1* | 3/2018 | Andersen | B01J 23/52 |
| 2020/0091308 | A1* | 3/2020 | Manipatruni | H01L 29/516 |
| 2020/0273864 | A1 | 8/2020 | Manipatruni et al. | |
| 2020/0273865 | A1* | 8/2020 | Manipatruni | H01L 28/90 |
| 2020/0273866 | A1 | 8/2020 | Manipatruni et al. | |
| 2020/0273867 | A1 | 8/2020 | Manipatruni et al. | |
| 2020/0303343 | A1 | 9/2020 | Manipatruni et al. | |
| 2020/0303344 | A1 | 9/2020 | Manipatruni et al. | |
| 2020/0321344 | A1 | 10/2020 | Ramamoorthy et al. | |
| 2020/0321472 | A1 | 10/2020 | Ramamoorthy et al. | |
| 2020/0321473 | A1 | 10/2020 | Ramamoorthy et al. | |
| 2020/0321474 | A1 | 10/2020 | Ramamoorthy et al. | |
| 2021/0202507 | A1* | 7/2021 | Thareja | G11C 11/221 |
| 2021/0202510 | A1 | 7/2021 | Thareja et al. | |
| 2021/0202689 | A1 | 7/2021 | Thareja et al. | |
| 2021/0202690 | A1 | 7/2021 | Thareja et al. | |
| 2021/0203324 | A1 | 7/2021 | Manipatruni et al. | |
| 2021/0203325 | A1 | 7/2021 | Manipatruni et al. | |
| 2021/0203326 | A1 | 7/2021 | Manipatruni et al. | |
| 2021/0226636 | A1 | 7/2021 | Manipatruni et al. | |

OTHER PUBLICATIONS

Seymen Murat Aygun, Processing Science of Barium Titanate, North Carolina State University, 2009, All pages. (Year: 2009).*

Chang, S. et al., "A Thermodynamic Perspective of Negative-Capacitance Field-Effect Transistors", IEEE Journal on Exploratory Solid-State Computational Devices and Circuits; Received Jun. 16, 2017; date of current version Oct. 4, 2017. DOI: 10.1109/JXCDC. 2017.2750108. 9 pages.

Chang, S. et al., "Inversion Charge Boost and Transient Steep-Slope Induced by Free-Charge-Polarization Mismatch in a Ferroelectric-Metal-Oxide-Semiconductor Capacitor", IEEE Journal on Exploratory Solid-State Computational Devices and Circuits; Received Apr. 9, 2018; date of current version Jul. 27, 2018. DOI: 10.1109/ JXCDC.2018.2846202. 6 pages.

Chang, S. et al., "Physical Origin of Transient Negative Capacitance in a Ferroelectric Capacitor", Components Research, Intel Corporation, Hillsboro, Oregon 97124, USA; arXiv:1709.03255v1 [physics. app-ph] Sep. 11, 2017; Phys. Rev. Applied 9, 014010 (2018), DOI: 10.1103/PhysRevApplied.9.014010. 5 pages.

Khan, A. et al., "Experimental Evidence of Ferroelectric Negative Capacitance in Nanoscale Heterostructures", Appl. Phys. Lett. 100, 089904 (2012). 33 pages.

Mundy, J. et al., "Atomically engineered ferroic layers yield a room-temperature magnetoelectric multiferroic", Sep. 22, 2016; vol. 537; Nature; 523. DOI: 10/1038/nature19343.

Van Den Brink, J. et al., "Multiferroicity due to Charge Ordering", ESFR Aug. 2, 2011. J. Phys.: Condens. Matter 20, 434217 (2008). DOI:10.1088/0953-8984/20/43/434217. 71 pages.

Xu, K. et al., "Designing New Improper Ferroelectrics with a General Strategy", npj Quantum Materials 2, Article No. 1. 2017. DOI: 10.1038/S41535-016-0001-8. 17 pages.

Yang, H. X. et al., "Multi-ferroelectricity in charge ordered LuFe2O4(LuFeO3)n with n=1". Beijing National Laboratory for Condensed Matter Physics, Institute of Physics, Chinese Academy of Sciences, Beijing 100080, P. R. China. 2018. 19 pages.

Junquera, Javier, "When One Plus One is More than Two", Physics 9, 28, Mar. 14, 2016, 2 pgs.

* cited by examiner

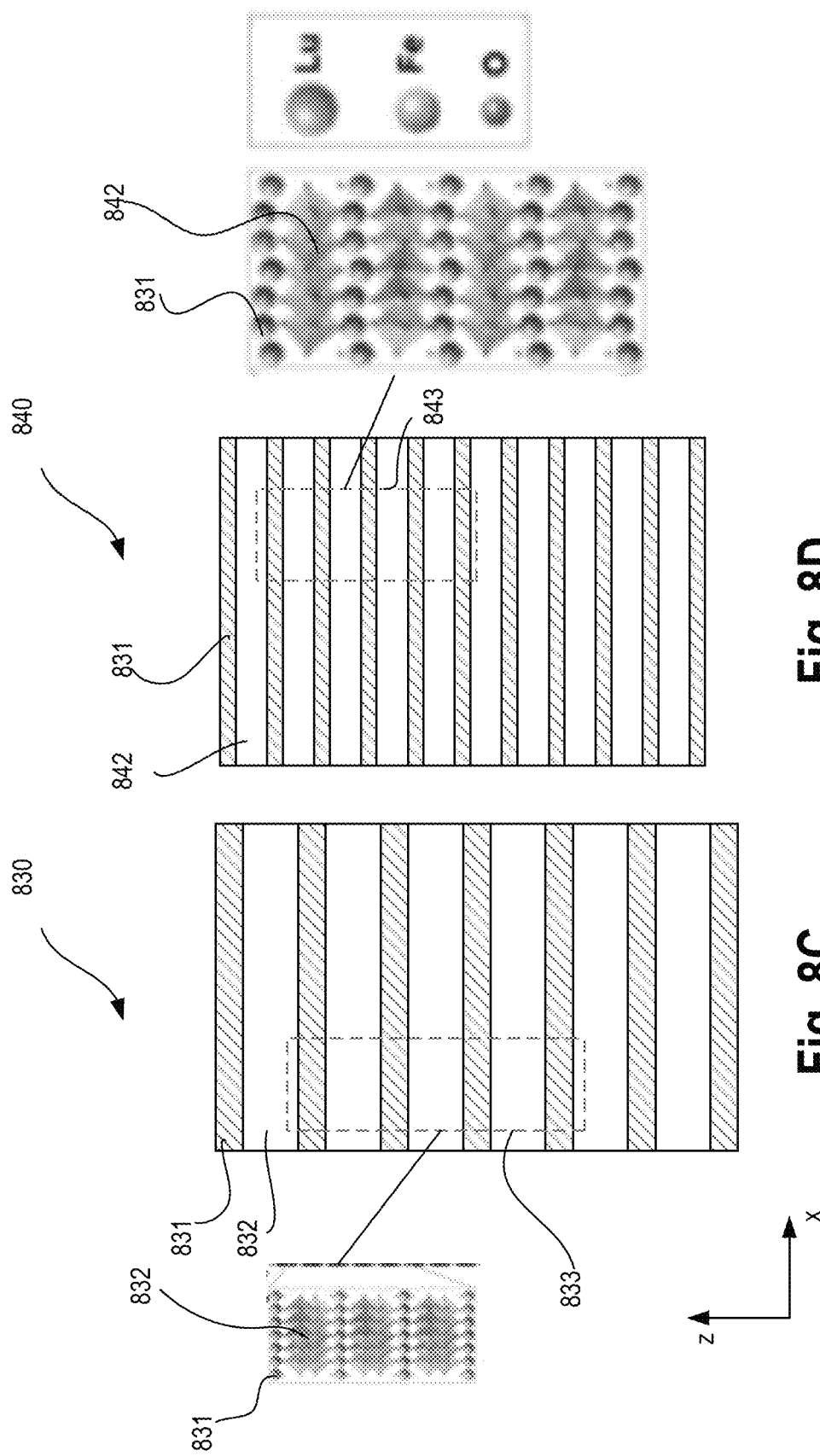

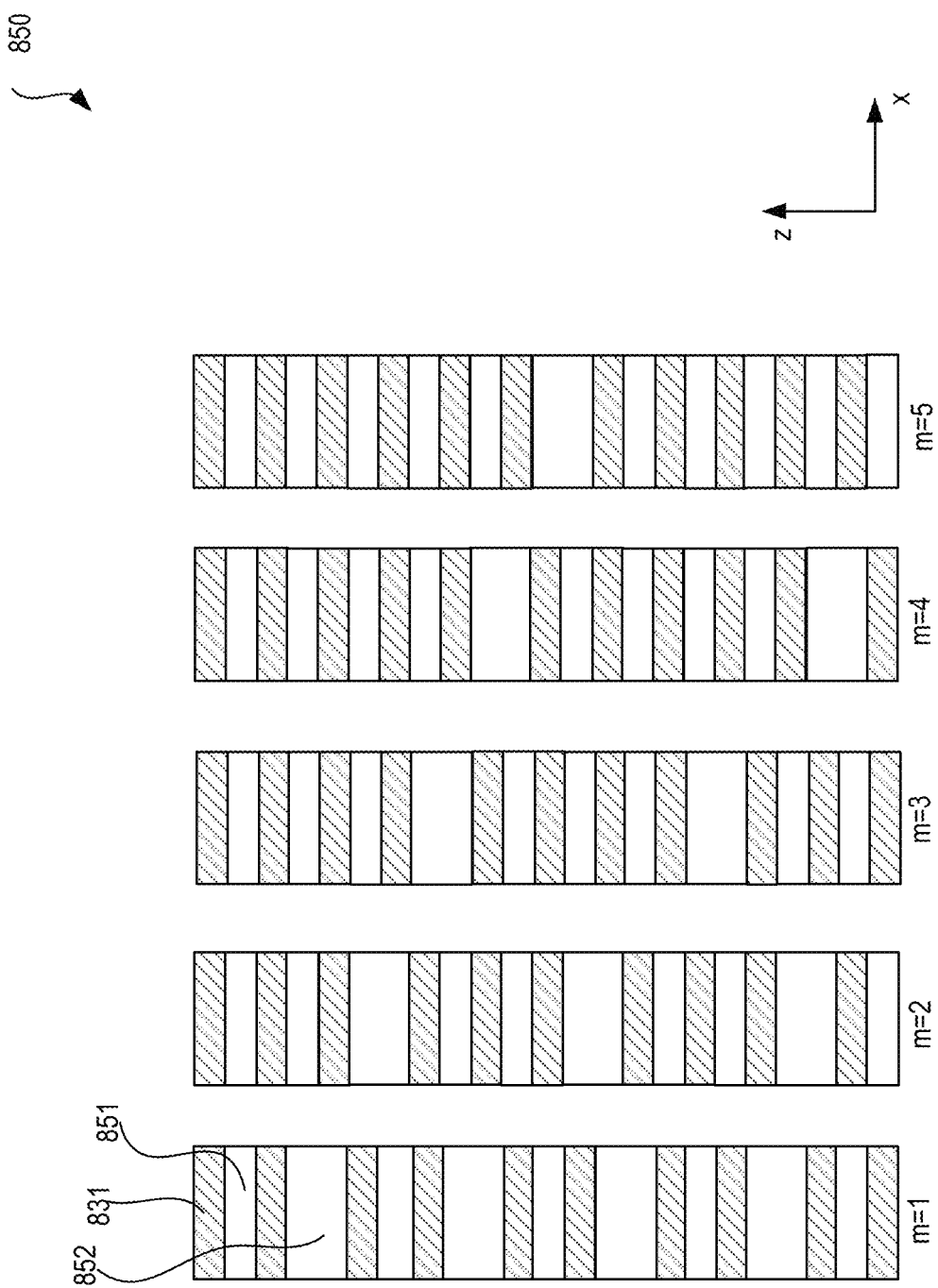

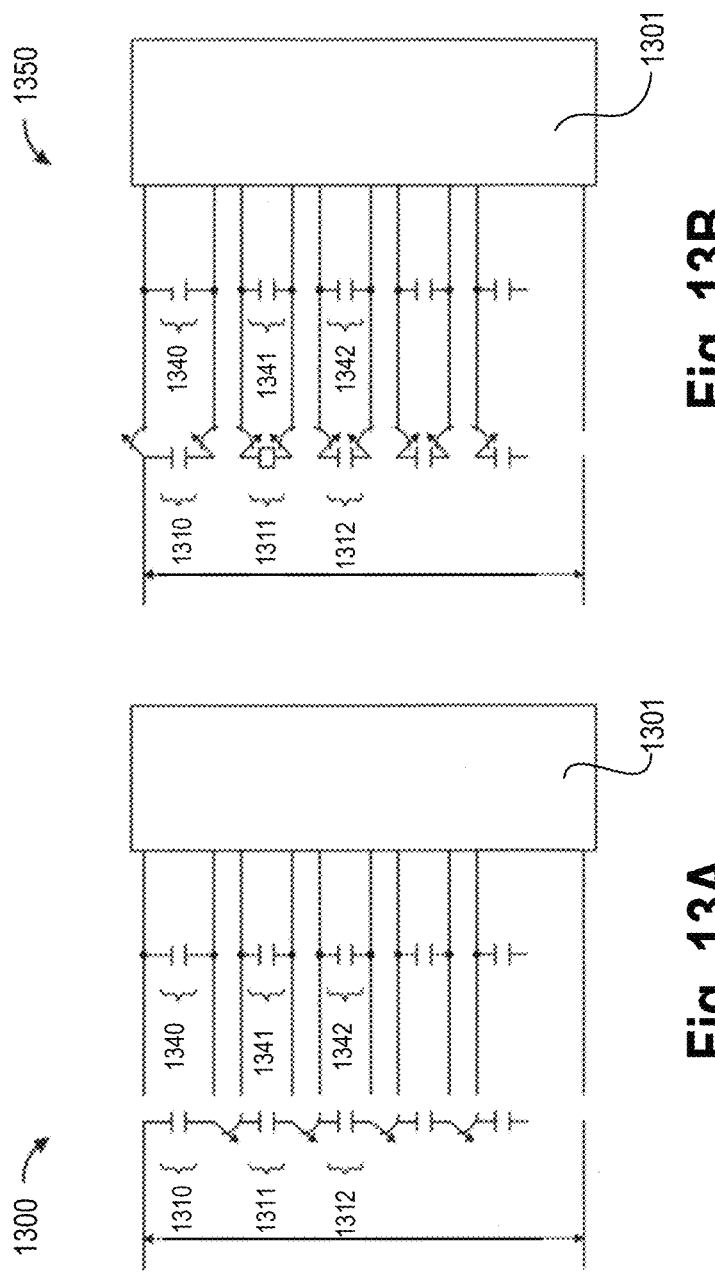

IMPROPER FERROELECTRIC ACTIVE AND PASSIVE DEVICES

BACKGROUND

Devices such as high charge capacity capacitors (e.g., metal-insulator-metal (MIM) capacitors) for backend can be formed as passive circuit elements or transistors (e.g., metal-oxide-semiconductor (MOS) transistors) for frontend as active circuit elements. Passive circuit elements can be used to provide charge storage and sharing, while active circuit elements can be used to enable low voltage and high current power supply. However, backend MIM capacitors are limited by Hafnium Oxide (HfO) which may be already scaled to sub 10 nm thickness. Traditional ferroelectric capacitors are low retention durations. New materials are desired to make capacitors with longer retentions. As traditional transistors scale down in size, their drive strength weakens due to short-channel effects. New materials are also desired for increasing the on-current of transistors as they scale down in size.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 8C-D illustrate improper FE super lattices, according to some embodiments of the disclosure.

FIG. 8E illustrates improper FE super lattices with various configurations, according to some embodiments of the disclosure.

FIGS. 13A-B illustrate apparatuses 1300 and 1350 for switch mode power supply during charging and discharging modes, respectively, according to some embodiments of the disclosure.

DETAILED DESCRIPTION

Figure 1:
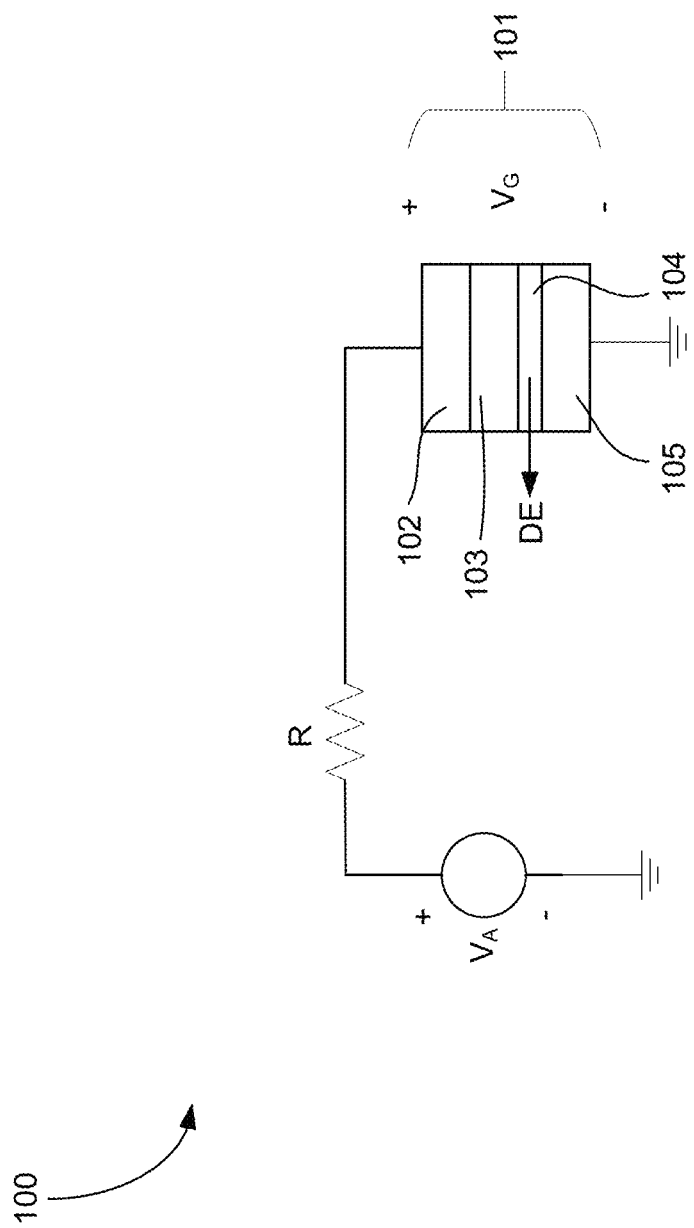
FIG. 1 illustrates a schematic of a RC (resistor-capacitor) circuit comprising a ferroelectric (FE) capacitor with p-type conductivity silicon.

The relentless pursuit of Moore's law in the past four decades led to a significant improvement in the computing power of modern microprocessors. However, as the scaling of complementary metal oxide semiconductor (CMOS) transistors continues, the on/off current ratio is dramatically reduced. The increase in static power makes the circuit design more difficult for energy-efficient applications. One way to make a more energy efficient device is using a transistor structure using the ferroelectric (FE) oxide in the gate-stack. This FE oxide in the gate stack of a transistor improves subthreshold swing (SS) through stabilizing the FE negative capacitance in the steady state using the S-shape of polarization-electric field (P-E) relation given by Landau's free-energy functional.

A transient differential negative capacitance is observed from a circuit composed of a resistor and an FE capacitor in series. This differential negative capacitance is driven by the free-charge-polarization mismatch, which can be well described under Landau's mean field theory. The transient differential negative capacitance has been also experimentally observed in an FE MOS capacitor, indicating the existence of transient mismatch between bound charge and free charge in a resistor-MOS capacitor network.

A negative curvature attribute for an FE material can be observed by plotting charge accumulation in the FE material over electrostatic energy applied across the FE material. Existing normal FE materials exhibit a wide negative curvature (e.g., 1 or more nano-Coulombs of charge accumulation) that provides an equivalent negative capacitance. For example, the window between the positive spring constants, that shows the two-storage state remnant polarization for the normal FE material, is wide enough that a large voltage is needed to switch the FE material from one storage state to another storage state. Further, the electrostatic energy barrier for normal FE materials is not that high resulting in short retention times of the data in the FE material.

Various embodiments use improper FE material instead of normal FE material to realize narrower polarization minima and taller negative curvature attributes (e.g., higher energy barriers). Compared to the window between the positive spring constants of a normal FE material, the window between the positive spring constants of an improper FE material is narrower. A narrower window means that smaller voltage (compared to the voltage applied across the normal FE material) across the improper FE material is needed to switch the improper FE material from one state to another storage stage. Further, the electrostatic energy barrier for the improper FE materials is higher than the electrostatic energy barrier for the normal FE materials, resulting in longer retention times of the data in the improper FE material. As such, the negative curvature plot for the improper FE material is taller along the electrostatic energy axis with higher negative spring constant compared to the lower negative spring constant of a normal FE material. The negative curvature plot for the improper FE material is also narrower between the positive spring constants relative to the normal FE material. Examples of improper FE material include: super lattice of $PbTiO_3$ and $SrTiO_3$; super lattice of $SrZrO_3$ and $BaZrO_3$; $Ca_3B_2O_7$, where B is one of Mn or Ti or both; $St_3B_2O_7$, where B is one of Mn or Ti or both; $NaRTiO_4$, where R is one of Y, La, Na, Sm—Ho; super lattice $YFeO_3$ and $YTiO_3$; $AMnO_3$, where A is one of Tb or Y; $Sr_3Zr_2O_7$; $CdCr_2O_4$.

There are many technical effects of the various embodiments. For example, the taller and narrower negative curvature attributes for the improper FE material (compared to the normal FE material) enables: improved electro-statics for transistor applications, transient negative capacitance for use in novel circuits, and steady state negative capacitance for voltage boost circuits. The improper FE material allows to decouple negative capacitance from switching energy, provide higher negative capacitance relative to normal FE material, and reduce the charge needed for accessing the negative capacitance region. In some embodiments, improper FE material is used in a gate stack of a transistor to increase transistor on-current (or drive current). In some embodiments, improper FE material can be used to form backend capacitors with higher storage capacity and/or longer retention times compared to capacitors formed with normal FE materials. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates schematic 100 of a RC circuit comprising a FE capacitor 101 with p-type conductivity silicon. FE capacitor 101 comprises metal layer (or structure) 102, FE layer 103, dielectric (DE) 104, and p-type silicon 105 coupled together as shown. Here, a numerical model is described to investigate the transient charging/discharging behavior of FE MOS capacitor 101 in a R-C$_{FEMOS}$ circuit of schematic 100. From the model, it is found that an inversion charge boost, leading to an increase in the drive current of a transistor, can be achieved by transient steep subthreshold swing (SS) driven by a free-charge-polarization mismatch. The impact of the FE response time on the charge boost is also investigated, and the material targets for an FE field-effect transistor to be applicable for the next-generation digital switch are identified, in accordance with various embodiments.

To describe the transient response of a R-C$_{FEMOS}$ circuit of schematic 100, Kirchhoff's law is used to describe the free-charge density flowing through the resistor given as:

$$\frac{\partial P}{\partial t} = \frac{V_A - V_G}{AR} \qquad \text{Equation (1)}$$

where $\rho_s$ is the free-charge density on a capacitor, $V_A$ is the applied voltage, $V_G$ is the gate voltage, A is the cross-sectional area of the capacitor, and R is the resistance of a series resistor. The average polarization dynamics of the FE oxide, P, is based on Landau's mean field theory given as:

$$\gamma \frac{\partial P}{\partial t} = -\frac{\partial U}{\partial P} = -2\alpha_1 P - 4\alpha_{11} P^3 - \alpha_{111} P^5 + E_{FE} \qquad \text{Equation (2)}$$

where $\alpha_1$, $\alpha_{11}$, and $\alpha_{111}$ are the Landau expansion coefficients describing a double well FE free-energy profile, U, and $E_{FE}$ is the electric field across the FE oxide. From electrostatics, the voltage across the FE oxide, $V_{FE}$, is given as:

$$V_{FE} = E_{FE} t_{FE} = \frac{t_{FE}(\rho_s - P)}{\varepsilon_0} \qquad \text{Equation (3)}$$

in which $t_{FE}$ is the FE oxide thickness and $\varepsilon_0$ is the vacuum dielectric (DE) constant. In an FE MOS capacitor, the gate voltage, $V_G$, is shared within the vertical stack, namely, $$V_G = V_{metal} + V_{FE} + V_{DE} + V_{Si} + V_{fb} \qquad \text{Equation (4)}$$

where $V_{metal}$ and $V_{DE}$ are the voltages across metal 102 and the DE 104, respectively, $V_{Si}$ is the silicon surface potential drop and $V_{fb}$ is the flat-band voltage given as $$\frac{\varphi_1 - \varphi_2 - E_{f,metal} - \delta}{e}$$

with $\varphi_1$ and $\varphi_2$ being conduction band discontinuities at the metal 102 and FE 103, and DE 104 silicon 105 interfaces, respectively, $E_f$ is the Fermi energy of metal 102, $\delta$ is the energy difference between conduction band and Fermi level in the quasi-equilibrium region of p-type silicon 105, and e is elementary charge. For a given $\rho_s$, $V_{metal}$ and $V_{DE}$ are given as:

$$V_{metal} = \frac{\rho_s \lambda_{metal}}{\varepsilon_{metal} \varepsilon_0} \qquad \text{Equation (5)}$$

-continued $$V_{DE} = \frac{\rho_s t_{DE}}{\varepsilon_{DE}\epsilon_0} \quad \text{Equation (6)}$$

where $\lambda_{metal}$ and $\varepsilon_{metal}$ are the screening length and relative DE constant of metal, respectively, and $t_{DE}$ and $\varepsilon_{DE}$ are the thickness and relative DE constant of DE 104, respectively. With a given $\rho_s$, the induced net charge at the silicon side, $Q_{net}=-\rho_s$, and corresponding $V_{Si}$ are obtained by self-consistently solving Schrödinger and Poisson equations given from equations (7)-(10) with the Newton-Raphson method for convergence, where (100) wafer orientation is used for silicon:

$$\left[-\frac{\hbar^2}{2m_j}\frac{\partial^2}{\partial x^2} \mp eV_{Si}(x)\right]\Psi_{ij}(x) = E_{ij}\Psi_{ij}(x) \quad \text{Equation (7)}$$

$$n(x) = \sum_{j=l,t} \frac{k_B T g_{,j} m_{d,j}}{\pi \hbar^2} \Sigma_i \log\left[1+e^{\frac{E_{f,si}-E_{ij}}{k_B T}}\right]|\Psi_{ij}(x)|^2 \quad \text{Equation (8)}$$

$$p(x) = \sum_{j=hh,lh} \frac{k_B T m_{d,j}}{\pi \hbar^2} \Sigma_i \log\left[1+e^{\frac{E_{f,si}-E_{ij}}{k_B T}}\right]|\Psi_{ij}(x)|^2 + \quad \text{Equation (9)}$$

$$\frac{k_B T m_{dso}}{\pi \hbar^2} \Sigma_i \log\left[1+e^{\frac{E_{f,si}-E_{i,so}-\Delta_{so}}{k_B T}}\right]|\Psi_{i,so}(x)|^2$$

$$\frac{\partial^2 V_{Si}(x)}{\partial x^2} = \frac{-Q_{net}}{\epsilon_{Si}\epsilon_0} = \frac{-e}{\epsilon_{Si}\epsilon_0}[p(x)-n(x)-N_A] \quad \text{Equation (10)}$$

In equations (7)-(10), $m_j$ is the effective mass of valley j for electrons or holes, $\Psi_{ij}$ and $E_{ij}$ are the envelop function and energy of valley j in the sub-band i, respectively, $k_B$ is Boltzmann's constant, T is the temperature, g,i is the valley degeneracy factor, $m_{d,j}$ is the density-of-state effective mass of valley j for electrons or holes, Nh is the reduced Planck constant, $E_{f,si}$ and $V_{Si(x)}$ are the Fermi level in the quasi-equilibrium region and the surface potential profile within p-type silicon, respectively, $\epsilon_{Si}$ is the relative DE constant of silicon, and $N_A$ is the p-doped (acceptor) concentration.

Equations (1)-(10) are solved numerically for convergence at every time step to describe the transient charging and the discharge behavior of FE MOS capacitor 101 in series with a resistor. The results of high-k MOS capacitors are also given to help illustrate the concept, and the modification in the model is replacing $V_{FE}$ in Equation (3) with the voltage across the high-k DE, $V_{high-k}$, given as:

$$V_{high-k} = \frac{\rho_s t_{high-k}}{\epsilon_{high-k}\epsilon_0} \quad \text{Equation (11)}$$

where $t_{high-k}$ and $\epsilon_{high-k}$ are the thickness and relative DE constant of the high-k layer, respectively. The numerical model described above is justified by qualitatively capturing the transient negative differential capacitance reported in the recent experimental measurements when a bipolar voltage pulse is applied to a hafnium-based FE MOS capacitor, as given in the Supplementary Material. Note that the effect of interface charge between the FE 103 and DE 104 layers, which is not included in this paper, can be described by:

$$\rho_{int} + \epsilon_{DE}\epsilon_0 E_{DE} = \epsilon_0 E_{FE} + P \quad \text{Equation (12)}$$

where $\rho_{int}$ is the interface charge density and $E_{DE}$ is the electric field across the DE layer 104, defined as $(V_{DE}/t_{DE})$. From equation (12), it can be seen that the depolarization field across the FE layer 103, which determines the amount of inversion charge boost in an FE MOS capacitor 101, can be significantly modulated if $\rho_{int}$ is large enough.

Figure 2:
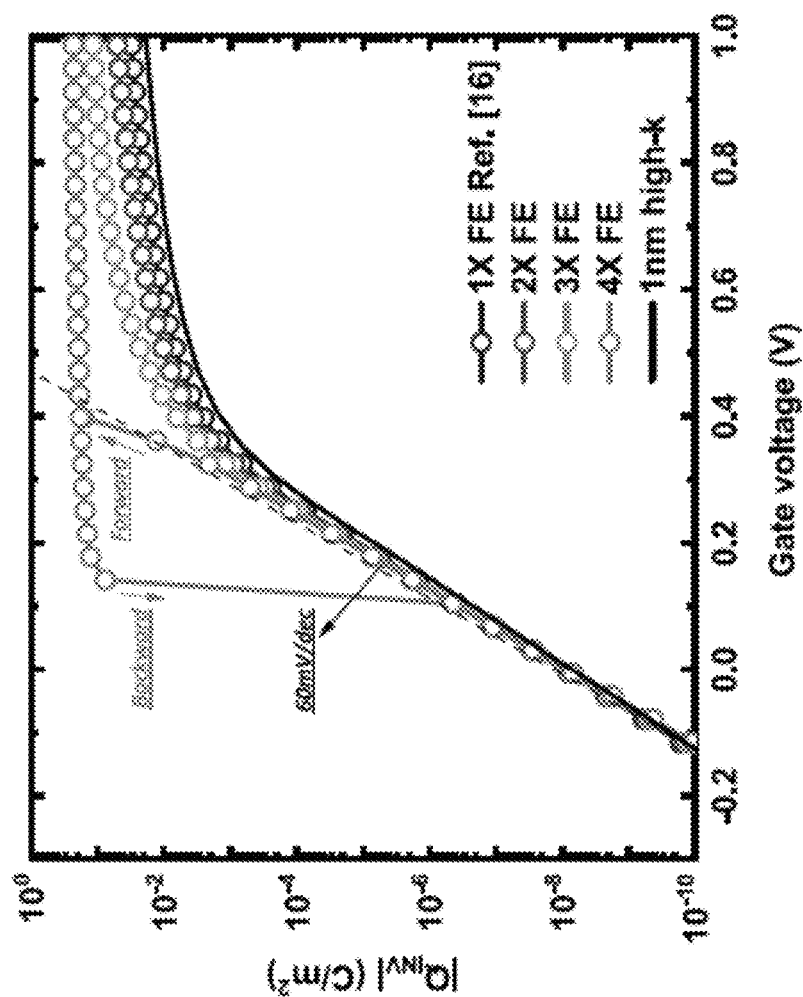
FIG. 2 illustrates a plot showing inversion charge density at room temperature (RT) as a function of gate voltage with different FE strengths and high-k dielectric (DE) under steady state.

FIG. 2 illustrates plot 200 showing inversion charge density at RT as a function of gate voltage with different FE strengths and high-k dielectric (DE) under steady state. FIG. 2 shows the inversion charge density under forward and reverse applied voltage sweeps, where the pulse duration for each applied voltage is long enough to make sure the charge on a capacitor in the RC circuit reaches the steady state. This scenario can be considered as a slow DC (direct current) sweep in the experimental measurements as long as the FE response is not too slow. From FIG. 2, it can be seen that a significant charge boost can be achieved in the strong inversion region from an FE MOS capacitor compared with the conventional high-k one. A stronger FE oxide delivers a greater charge boost due to a larger depolarization field across the FE oxide, which will be explained later. Note that a stronger FE oxide here means a wider double-well free energy profile with a deeper barrier height, which physically corresponds to a larger coercive field and also a greater remnant polarization.

This trend is also consistent to the result based on the classical approach to the relation between inversion charge and silicon surface potential and the one based on double-gate thin body structures. Interestingly, FIG. 2 implies that when the measurement time is much slower than the FE response, a significant charge boost can be delivered without SS sharper than 60 mV/decade in the forward sweep. Next, the underlying mechanism that drives this inversion charge boost in the steady state is investigated by applying a voltage pulse with a fixed magnitude to an FE MOS capacitor.

Figure 3A:
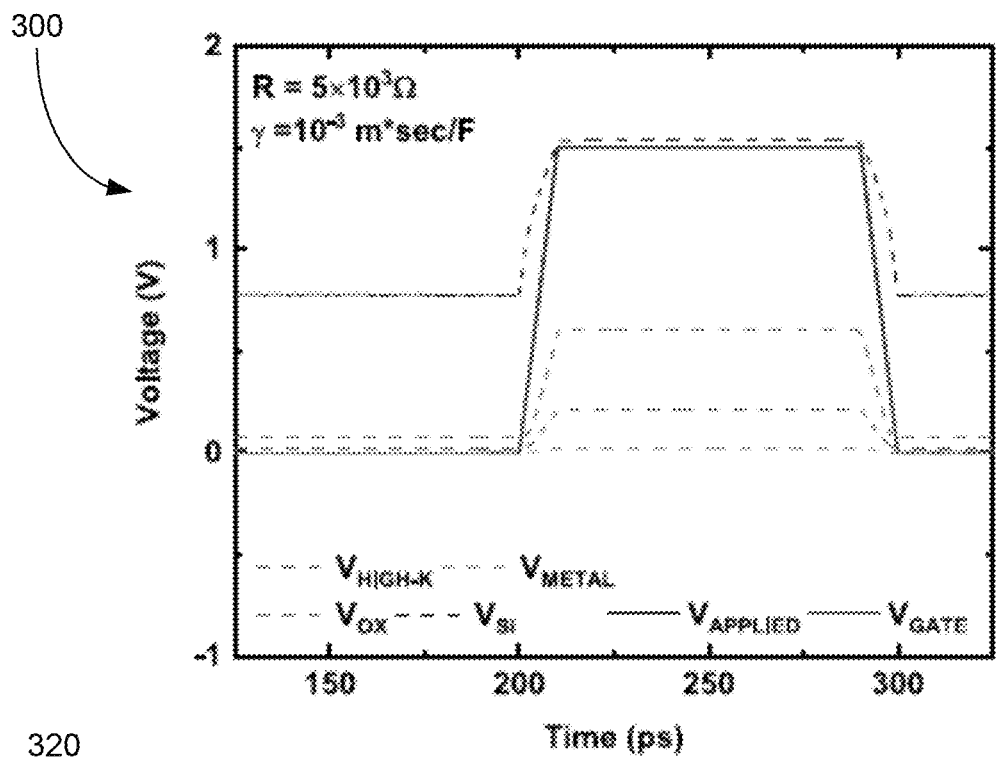
FIG. 3A illustrates a plot showing transient voltage distribution in each layer of a high-K capacitor when a positive voltage pulse is applied.
Figure 3B:
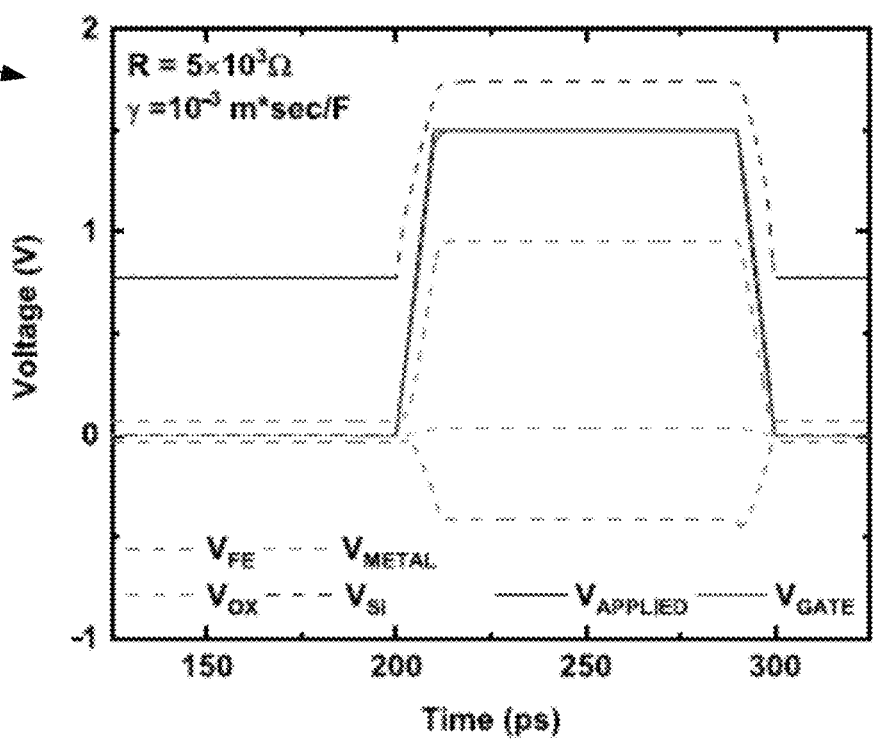
FIG. 3B illustrates a plot showing transient voltage distribution in each layer of a FE metal oxide semiconductor (MOS) capacitor when a positive voltage pulse is applied.

FIG. 3A illustrates plot 300 showing transient voltage distribution in each layer of a high-K capacitor when a positive voltage pulse is applied. FIG. 3B illustrates plot 320 showing transient voltage distribution in each layer of a FE metal oxide semiconductor (MOS) capacitor when a positive voltage pulse is applied.

FIG. 3A and FIG. 3B shows the transient voltage response in each layer for both the high-k and FE MOS capacitors, respectively, and it can be observed that the main difference between the high-k and FE capacitors is the opposite sign of voltage drops across the high-k and FE layers in the steady state. In addition, under the steady state, it can be seen that the direction of field across the FE oxide in the case of charge boost is opposite to that of polarization, which is one key feature of depolarization. Hence, to achieve the inversion charge boost in the steady state, the field across the FE oxide is dominated by the depolarization, rather than the applied bias.

From FIG. 3B, to make the depolarization dominate the field across the FE oxide in the steady state, the capacitor goes through a transient region, where the voltage drop across the FE oxide decreases with time, that is, $$\frac{\partial V_{FE}}{\partial t} < 0.$$

This negative $$\frac{\partial V_{FE}}{\partial t}$$

leans to a larger $$\frac{\partial V_{Si}}{\partial t}$$

(or transient steep SS, $$\left(\frac{\partial V_{Si}}{\partial V_g}\right)$$

and, thus, gives the FE MOS capacitor 101 a faster increase in the inversion charge. The inversion charge boost driven by a transient steep SS can be observed more clearly from FIG. 4A, where the boost increases with stronger ferroelectricity.

Figure 4A:
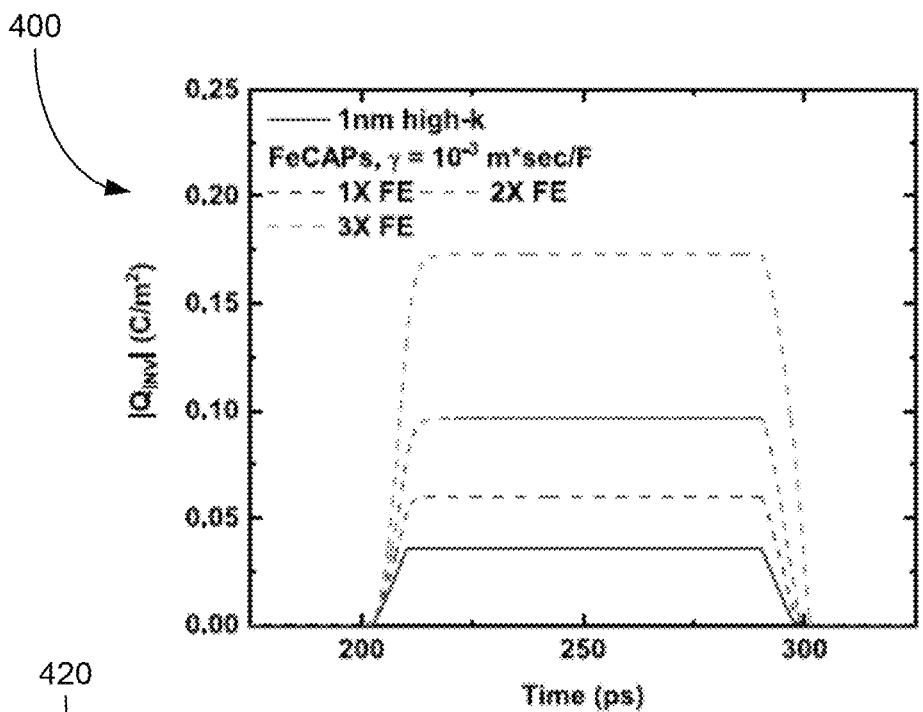
FIG. 4A illustrates a plot showing inversion charge density as a function of time when applying a positive pulse to an FE MOS capacitor with different FE strengths of oxide.

FIG. 4A illustrates plot 400 showing inversion charge density as a function of time when applying a positive pulse to an FE MOS capacitor with different FE strengths of oxide.

Figure 4B:
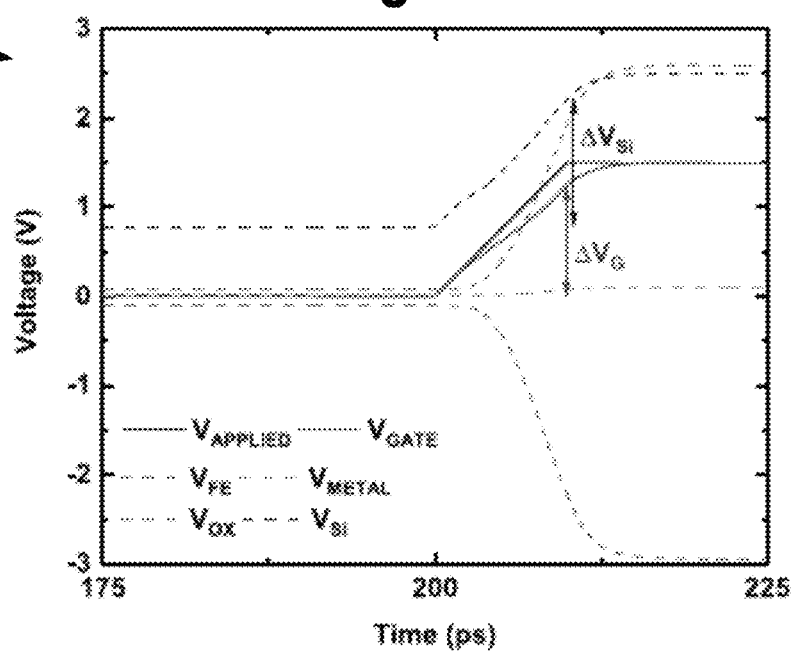
FIG. 4B illustrates a plot showing transient voltage distribution as a function of time for the highest charge boost shown in FIG. 4A.

FIG. 4B illustrates plot 420 showing transient voltage distribution as a function of time for the highest charge boost shown in FIG. 4A. Note that for all the cases shown in FIG. 4A, none of them shows sub-60 mV/decade during the steady-state forward voltage sweep as can be seen in FIG. 2. The field distribution as a function of time in each layer for the largest boost in FIG. 4A is given in FIG. 4B, where $\Delta V_{Si} > \Delta V_G$ is labeled and the corresponding average SS is approximately 52 mV/decade at room temperature (RT) based on $$SS = \left(\frac{\left(\frac{\partial V_{Si}}{\partial V_G}\right)(\partial \log_{10} I_{ds})}{\partial V_{Si}}\right)^{-1}$$

with $I_{ds}$ being the channel current. Since the steep SS (e.g., sub-60 mV/decade at RT) may occur in the transient state due to the free-charge-polarization mismatch, the key feature of depolarization effect on an FE MOS capacitor under DC or slow measurements should be the inversion charge boost, rather than steep SS. The physical origin of this transient SS can be understood by taking the time derivative of Equation (3) as shown in the following:

$$\frac{\partial V_{FE}}{\partial t} = \frac{t_{FE}}{\epsilon_0}\left(\frac{\partial \rho_s}{\epsilon_0} - \frac{\partial P}{\partial t}\right) \quad \text{Equation (13)}$$

From Equation (13), it can be seen that during charging of FE MOS capacitor 101, both $$\left(\frac{\partial P}{\partial t}\right) \text{ and } \left(\frac{\partial P}{\partial t}\right)$$

are positive; therefore, the one possibility to make $$\frac{\partial V_{FE}}{\partial t}$$

negative is $$\left(\frac{\partial P}{\partial t}\right) > \left(\frac{\partial \rho_s}{\epsilon_0}\right),$$

that is, the bound charge in the FE oxide changes faster than free charge on a capacitor.

$$\left(\frac{\partial P}{\partial t}\right)$$

is proportional to me curvature of the negative capacitance plot discussed with reference to FIG. 6.

Referring back to FIG. 4, since the capacitance of the FE layer 103 in an FE MOS capacitor 101, $C_{FE}$, is mathematically defined as:

$$C_{FE} = \frac{\partial \rho_s}{\partial V_{FE}} \quad \text{Equation (14)}$$

$C_{FE}$ transiently becomes negative as the mismatch between free charge and polarization in the ramping rate occurs. Note that to observe this transient free-charge-polarization mismatch (or transient steep SS) experimentally, the measurement time may need to be at the same time scale. If the measurement time is much longer than this free-charge polarization mismatch, the inversion charge boost can be observed as shown in FIG. 2.

From Equation (13), it can be seen that the FE response time plays a significant role for transient steep SS and, thus, the inversion charge-boost. Based on Landau's theory, Equation (13) can be rewritten into:

$$\frac{\partial V_{FE}}{\partial t} = \frac{t_{FE}}{\epsilon_0}\left(\frac{\partial \rho_s}{\epsilon_0} - \frac{1}{\gamma}\frac{\partial U}{\partial P}\right) \quad \text{Equation (15)}$$

Figure 5:
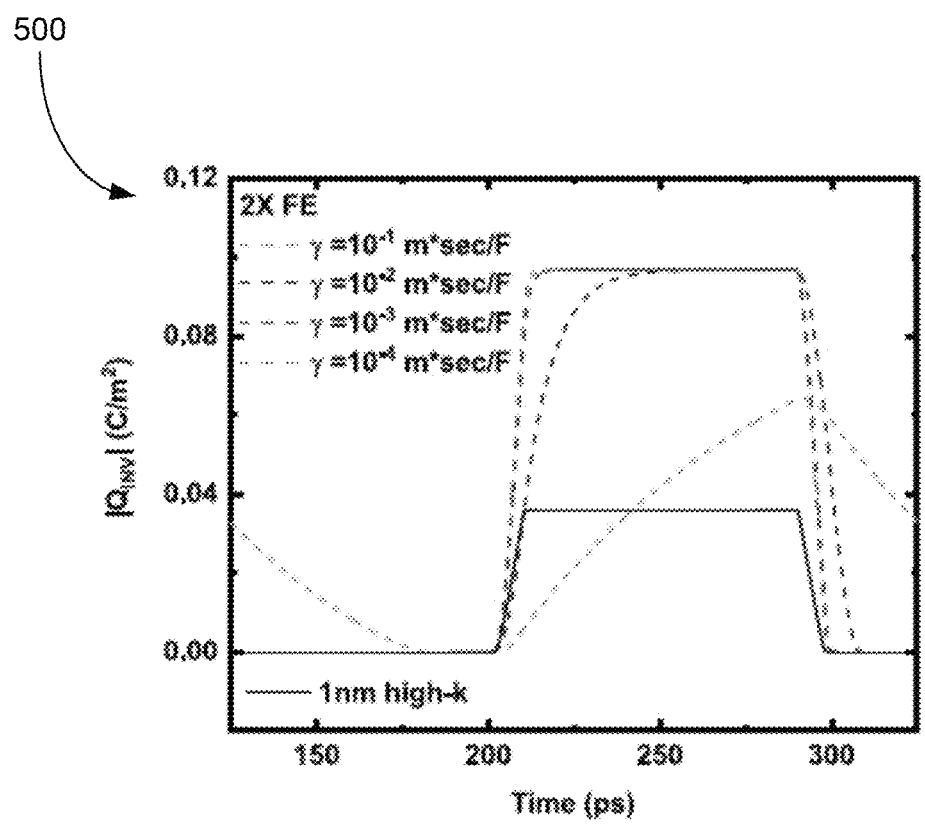
FIG. 5 illustrates a plot showing inversion charge density as a function of time for an FE MOS capacitor with different viscosity coefficients.

Equation (15) shows that the reduction of y, which means a faster FE response, leads to a steeper transient SS, as can be seen in FIG. 5, where less than $10^{-3}$ m*sec/F is approximately required for ramping up the inversion charge within 10 ps in a 100×20 nm² FE MOS capacitor.

FIG. 5 illustrates plot 500 showing inversion charge density as a function of time for FE MOS capacitor 101 with different viscosity coefficients. The performance improvements enabled by the FE layer 103 are preserved for frequencies up to GHz, which may also imply the fast-intrinsic FE response in scaled thin films (e.g., the target value identified in FIG. 5). FIG. 5 also implies that the characterization time in $I_{ds}-V_G$ measurements is also used to observe the charge boost due to the finite-FE response time; in other words, to observe a steep SS in the measurements, the time scale of significant free-charge-polarization mismatch is similar to that of voltage sweeps.

The above equation also shows that for a given gate voltage, stronger drive current can be achieved if the negative capacitive curvature is narrowed and made taller.

Figure 6:
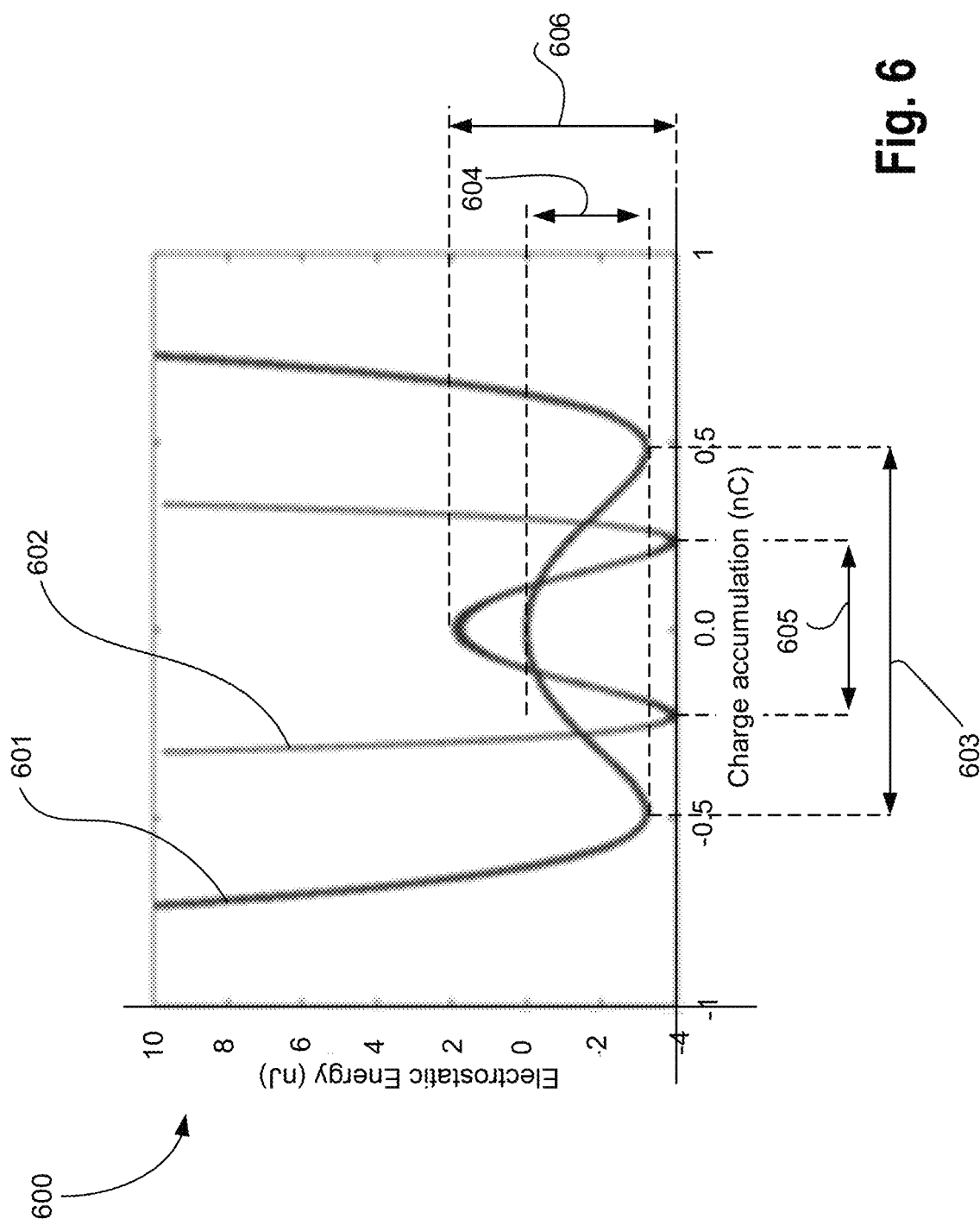
FIG. 6 illustrates a plot showing negative curvature of FE vs. improper FE, in accordance with some embodiments.

FIG. 6 illustrates a plot 600 showing negative curvature of normal FE 601 vs. improper FE 602, in accordance with some embodiments. Here, the x-axis is charge accumulation in nano-Coulombs (nC), and the y-axis is Electrostatic Energy (in nano-Joules (nJ)). A negative curvature attribute for an FE material can be observed by plotting charge accumulation in the FE material over electrostatic energy applied across the FE material. As discussed above with reference to Equations (1)-(15), stronger driver current and higher storage retention can be achieved by making the negative curvature plot narrower along the x-axis and taller along the y-axis.

Existing normal FE materials exhibit a wide negative curvature (e.g., 1 or more nano-Coulombs of charge accumulation) that provides an equivalent negative capacitance, as shown by curve 601. For example, the window 603 between the positive spring constants, that shows the two-storage state remnant polarization for the normal FE material, is wide enough that a large voltage is needed to switch the FE material from one storage state to another storage state. Further, the electrostatic energy barrier 604 for normal FE materials is not that high resulting in short retention times of the data in the FE material.

Various embodiments use improper FE material instead of normal FE material to realize narrower polarization minima (605) and taller negative curvature attributes (e.g., higher energy barrier 606) as shown by curve 602. Compared to the window 603 between the positive spring constants of a normal FE material, the window 605 between the positive spring constants of an improper FE material is narrower. A narrower window 605 means that smaller voltage (compared to the voltage applied across the normal FE material) across the improper FE material is needed to switch the improper FE material from one state to another storage state.

Further, the electrostatic energy barrier for the improper FE materials is higher than the electrostatic energy barrier for the normal FE materials, resulting in longer retention times of the data in the improper FE material. As such, the negative curvature plot for the improper FE material is taller along the electrostatic energy axis with higher negative spring constant compared to the lower negative spring constant of a normal FE material. For example, compare energy barriers 604 with 606. The negative curvature plot for the improper FE material is also narrower between the positive spring constants relative to the normal FE material. Examples of improper FE material include: super lattice of $PbTiO_3$ and $SrTiO_3$; super lattice of $SrZrO_3$ and $BaZrO_3$; $Ca_3B_2O_7$, where B is one of Mn or Ti or both; $St_3B_2O_7$, where B is one of Mn or Ti or both; $NaRTiO_4$, where R is one of Y, La, Na, Sm—Ho; super lattice $YFeO_3$ and $YTiO_3$; $AMnO_3$, where A is one of Tb or Y; $Sr_3Zr_2O_7$; $CdCr_2O_4$.

Figure 7:
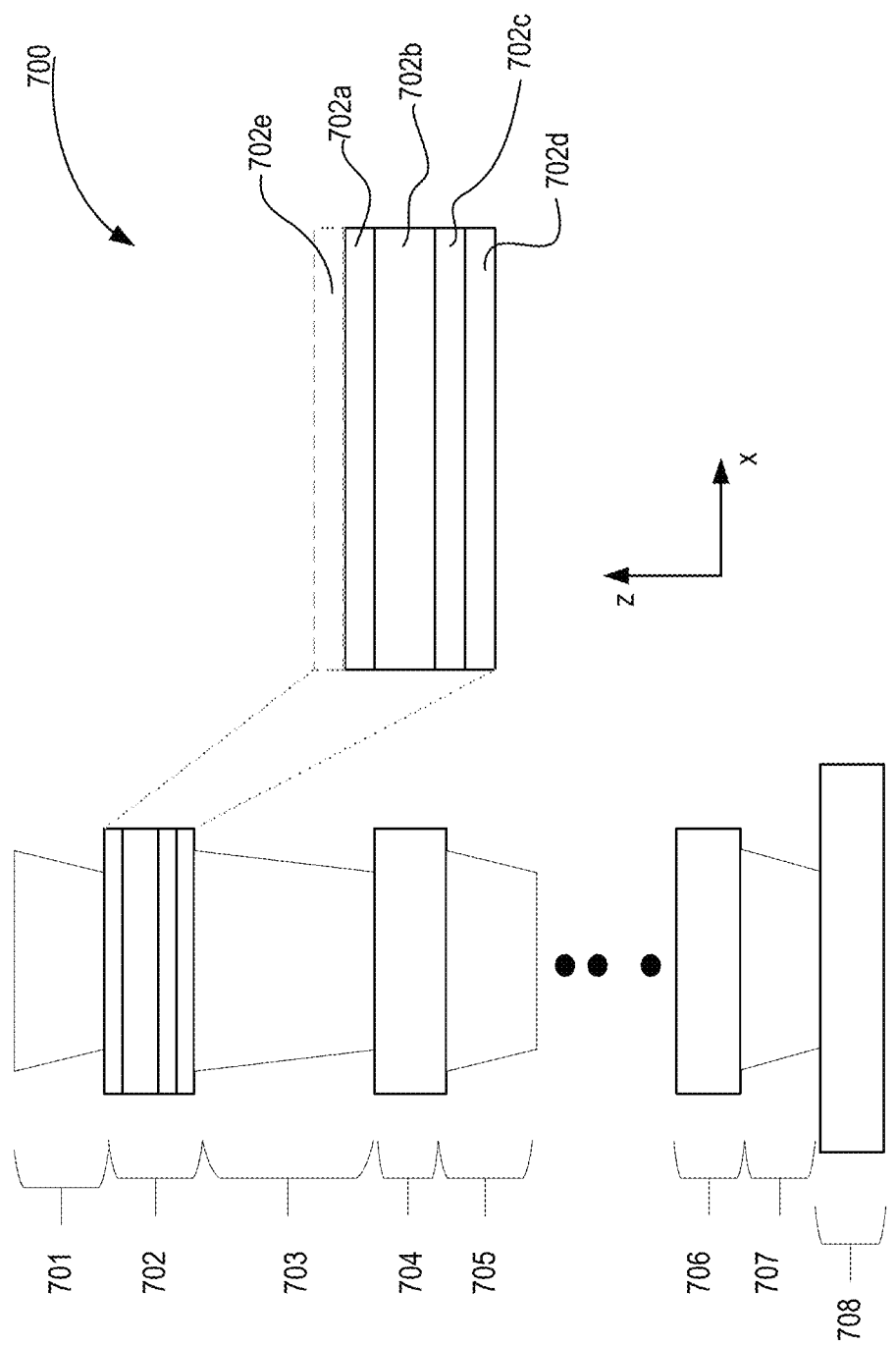
FIG. 7 illustrates a cross-section of a backend stack having a capacitor comprising improper FE, according to some embodiments of the disclosure.

FIG. 7 illustrates a cross-section 700 of a backend stack having a capacitor comprising improper FE, according to some embodiments of the disclosure. In some embodiments, a backend stack of layers includes a layer of metal interconnect (e.g., 701, 704, 706, and 708) and vias (e.g., 703, 705, 707). Here, the term "backend" generally refers to a section of a die which is opposite of a "frontend" and where an IC package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

In some embodiments, one or more of these interconnects (e.g., 701, 704, 706, and 708) can be parallel to one another or orthogonal to one another, in accordance with some embodiments. In some embodiments, all of these interconnects (e.g., 701, 704, 706, and 108) can be parallel to one another. In some embodiments, capacitor 702 can be fabricated between two metal layers, between a metal layer and a via, or between two vias, In some embodiments, capacitor 702 is a super capacitor for charge storage. The term "super capacitor", "supercapacitor" and "ultracapacitor" are interchangeable terms. A super capacitor can be used for storing large amounts of charge for providing backup power, regeneration braking storage, peak power assist, and other types of charge/discharge functions.

In some embodiments, capacitor 702 comprises a first conductive layer 702a, a layer 702b comprising improper FE material, a second conductive layer 702c, and a conductive seed layer 702d. In some embodiments, first and second conductive layers 702a/c are conductive oxides that include one of the following elements: Sr, Ru, La, Sr, Mn, Nb, Cr, or O. In some embodiments, first and second conductive layers 701a/c are conductive oxides which comprise: $SrRuO_3$, $(La,Sr)CoO_3$ [LSCO], $La_{0.5}Sr_{0.5}Mn_{1-x}Ni_xO$, Cu-doped $SrFe_{0.9}Nb_{0.1}O_3$, $(La,Sr)CrO_3$. In some embodiments, the conductive seed layer 702d comprises $In_2O_3$. In some embodiments, first and second conductive layers 701a/c comprise metals. Examples of such metals include TiN, TaN, Cu, and W.

In some embodiments, layer 702b comprises perovskite (an example of an improper FE) which is sandwiched between first and second conductive layers 702a/c such that layer 702b is adjacent to first and second conductive layers 702a/c. In some embodiments, layer 702b comprises a low leakage perovskite. Perovskites have cubic structure with a general formula of $ABO_3$, where 'A' includes one of an alkaline earth or rare earth element (e.g., Sr, Bi, Ba, etc.) while 'B' is one of a 3d, 4d, or 5d transition metal element (e.g., Ti, Fe, etc.). In some embodiments, layer 702b includes one of $SrTiO_3$, $BiFeO_3$, $BiTiO_3$, or $BaTiO_3$.

In some embodiments, layer 702b comprises multiple layers organized in a super lattice. In some embodiments, the super lattice comprises a super lattice of $PbTiO_3$ and $SrTiO_3$; super lattice of $SrZrO_3$ and $BaZrO_3$; $Ca_3B_2O_7$, where B is one of Mn or Ti or both; $St_3B_2O_7$, where B is one of Mn or Ti or both; $NaRTiO_4$, where R is one of Y, La, Na, Sm—Ho; super lattice $YFeO_3$ and $YTiO_3$; $AMnO_3$, where A is one of Tb or Y; $Sr_3Zr_2O_7$; and $CdCr_2O_4$. In some embodiments, the thickness of layer 702b along the z-direction is the range of 3 nm (nanometers) to 50 nm.

In some embodiments, a seed layer (or starting layer) 702d is deposited first and then layers 702c, 702b, 702a are deposited. In some embodiments, the seed layer 702d is used to template the conductive layer 702c. In some embodiments, a seed layer 702e is deposited in addition to or instead of 702d. In some embodiment seed layer 702d/e includes one of: Ti, Al, Nb, La, or STO ($SrTiO_3$). In some embodiments, seed layer 702d/e includes one of: TiAl, Nb doped STO, or La doped STO.

Figure 8A:
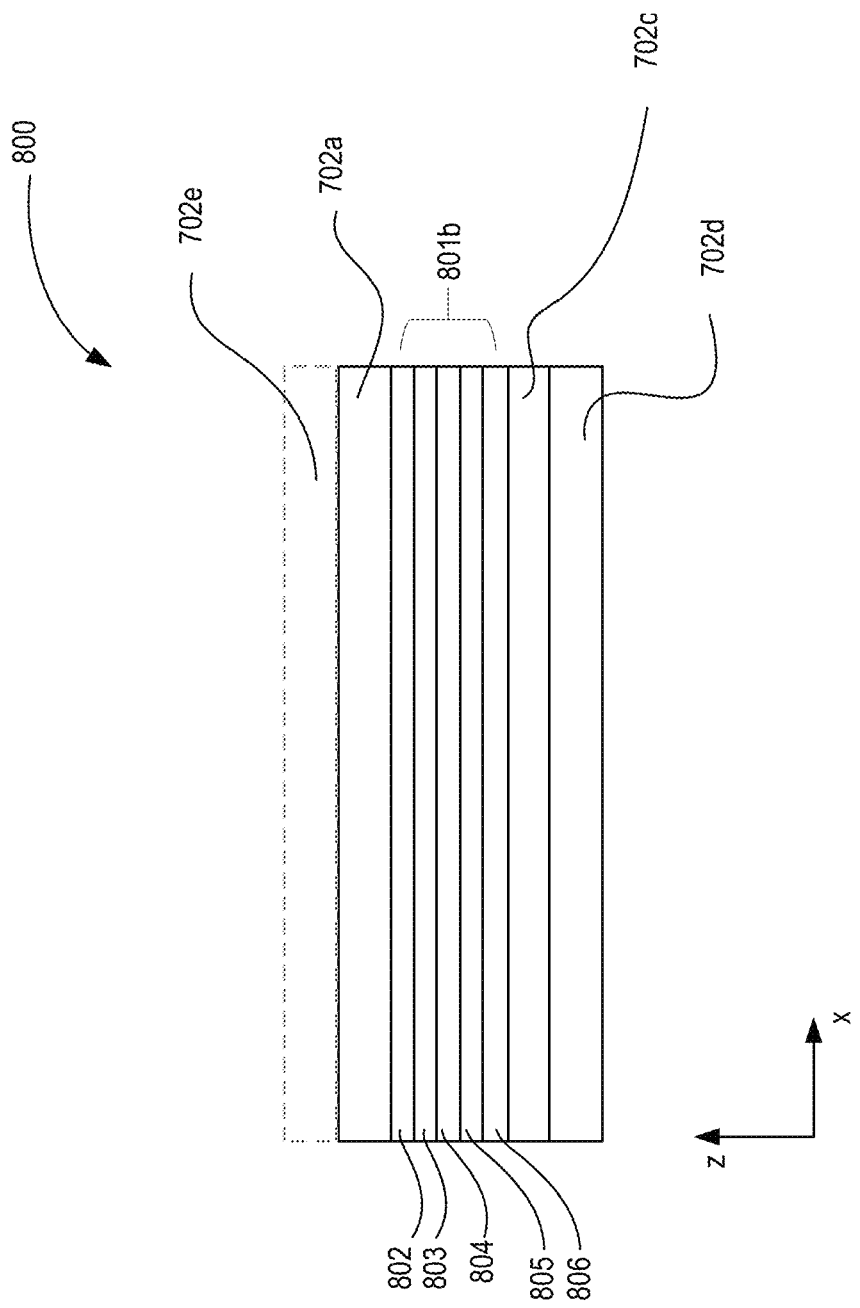
FIG. 8A illustrates a cross-section of an improper FE capacitor, according to some embodiments of the disclosure.

FIG. 8A illustrates a cross-section 800 of an improper FE capacitor, according to some embodiments of the disclosure. The improper FE capacitor of FIG. 8A is similar to the improper FE capacitor of FIG. 7 except that perovskite layer 702b is replaced by super lattice 801b. In some embodiments, super lattice 801b includes alternating layers of materials. For example, layer 802 comprises $PbTiO_3$, layer 803 comprises $SrTiO_3$, layer 804 comprises $PbTiO_3$, layer 805 comprises $SrTiO_3$, layer 806 comprises $PbTiO_3$, and so on (e.g., 2 to 100 times). In some embodiments, one layer can be a non-polar oxide of the type ($A^{+2}B^{+4}O_3$) such as $SrZrO_3$, and another layer can be a polar oxide of the type ($A^{+1}B^{+5}O_3$ or $A^{+3}B^{+3}O_3$) such as $LaAlO_3$ and $LaGaO_3$, where 'A' can comprise one of: La, Sr, Pb, Pr, Nd, Sm, Gd, Y, Tb, Dy, Ho, Er, Tm, Lu, Ce, Li, Na, K, Rb, or Ag, and 'B' can comprise Ga, Al, Sc, In, Ta, Ti, or Zr.

As more alternating layers of $PbTiO_3$ and $SrTiO_3$ are added, improper FE capacitor can store more charge. In some embodiments, the two or more layers of super lattice 801b have a thickness that extends from the first metal layer 701a to the second metal layer 702c. In some embodiments the thickness is in a range of 2 nm (nanometers) to 100 nm. In some embodiments, the two or more layers of super lattice 801b have a width which is perpendicular to the thickness, and wherein the width is in a range of 5 nm to 100 nm. In some embodiments, the super lattice is formed with PTO/STO (e.g., repeated 2 to 100 times) for capacitance enhancement. In some embodiments, the super lattice comprises of materials with improper ferroelectricity (e.g., STO/PTO, $LuFeO_3$/$LuFe_2O_4$).

In some embodiments, the alternating layers of the super lattice are layers of $SrZrO_3$ and $BaZrO_3$. In some embodiments, the alternating layers of the super lattice are layers of $YFeO_3$ and $YTiO_3$.

Figure 8B:
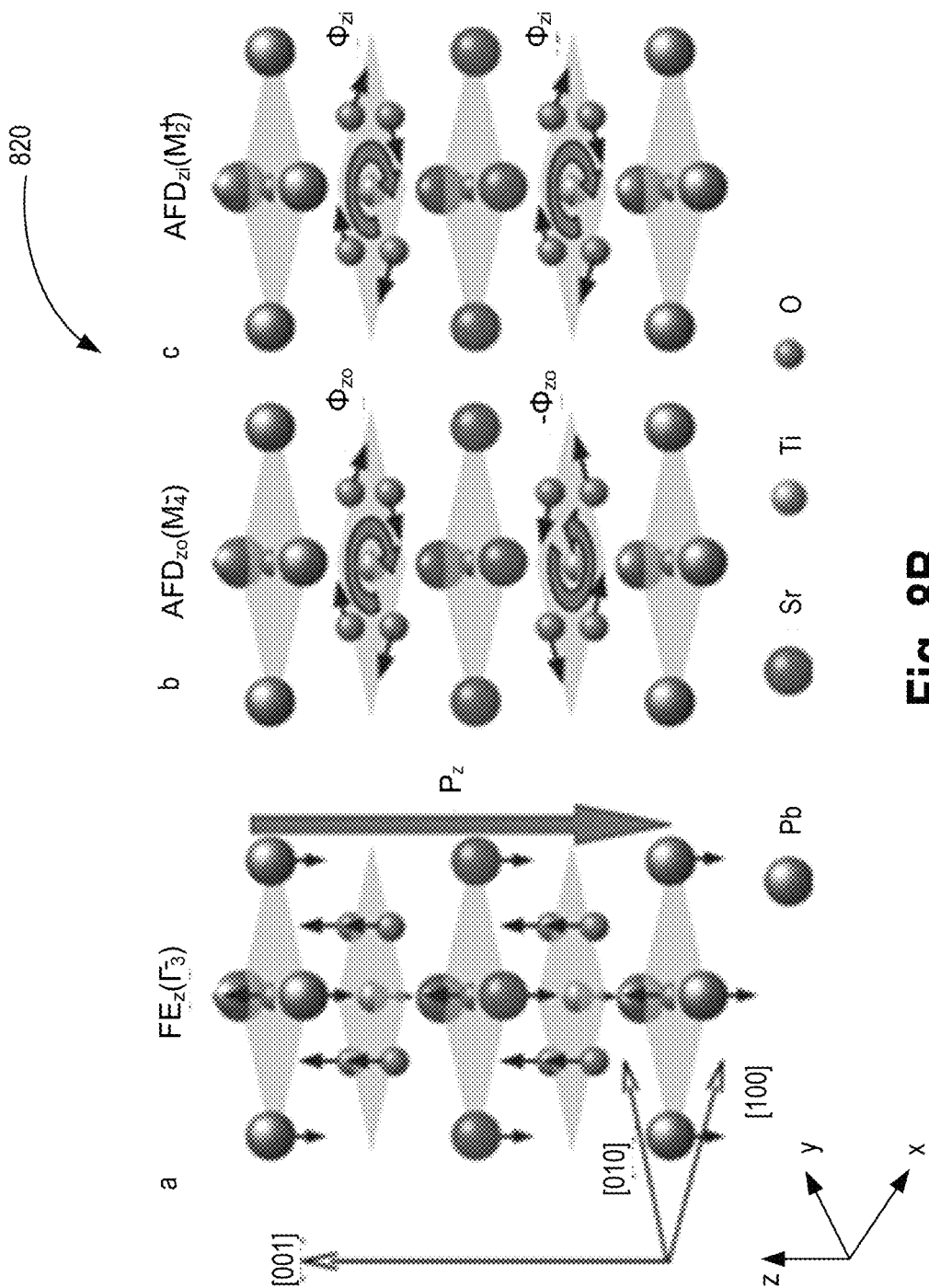
FIG. 8B illustrates a super lattice of $PbTiO_3$ (PTO) with $SrTiO_3$ (STO) according to some embodiments of the disclosure.

FIG. 8B illustrates a super lattice 820 of $PbTiO_3$ (PTO) with $SrTiO_3$ (STO) according to some embodiments of the disclosure. Three super lattices are shown in FIG. 8B. The first super lattice (a) is $FE_z$(T3− mode) giving rise to a polarization $P_z$. The second super lattice (b) is $AFD_{zo}$ ($M_4$− mode) with oxygen rotation angle $\phi_{ZO}$. The third super lattice is $AFD_{zi}$ ($M_2$+ mode) with oxygen rotation angle $\phi_{zi}$. Charge is stored in rotational degree of freedom of oxygen atoms indicated by the rotational arrows in super lattice (a) and (c).

FIGS. 8C-D illustrate improper FE super lattices 830 and 840, respectively, according to some embodiments of the disclosure. In some embodiments, super lattice 830 comprises alternate layers of 831 and 832. Here, region 833 is a zoomed version of the super lattice. In some embodiments, layer 831 comprises Lu. In some embodiments, layer 832 comprises $Fe_2O_4$.

In some embodiments, super lattice 840 comprises alternate layers of 831 and 842. Here, region 843 is a zoomed version of the super lattice. In some embodiments, layer 831 comprises Lu. Other materials for layer 831 include materials such as [$LuFeO_3$, $LuFe_2O_4$]$_n$; Co—Zr—$HfO_2$; metallic materials (CoFe, CoPt), and oxide materials ($Fe_3O_4$, LSMO (LaSrMnO)). In some embodiments, layer 842 comprises $FeO_3$.

FIG. 8E illustrates improper FE super lattices with various configurations, according to some embodiments of the disclosure. Here, super lattice 850 comprises a stack of $(LuFeO_3)_m$ and $(LuFe_2O_4)$, where 'm' is an integer, layer 831 comprises Lu, layer 851 comprises one unit of FeO molecules, and layer 852 comprises two units of FeO molecules. As such, layers 831, 851, and 852 together form $LuFeO_3$ while layers 831, 851, and 852 together form $LuFe_2O_4$. FIG. 8E illustrates super lattices with difference values of 'm' (e.g., m=1, 2, 3, 4, and 5).

Figure 9:
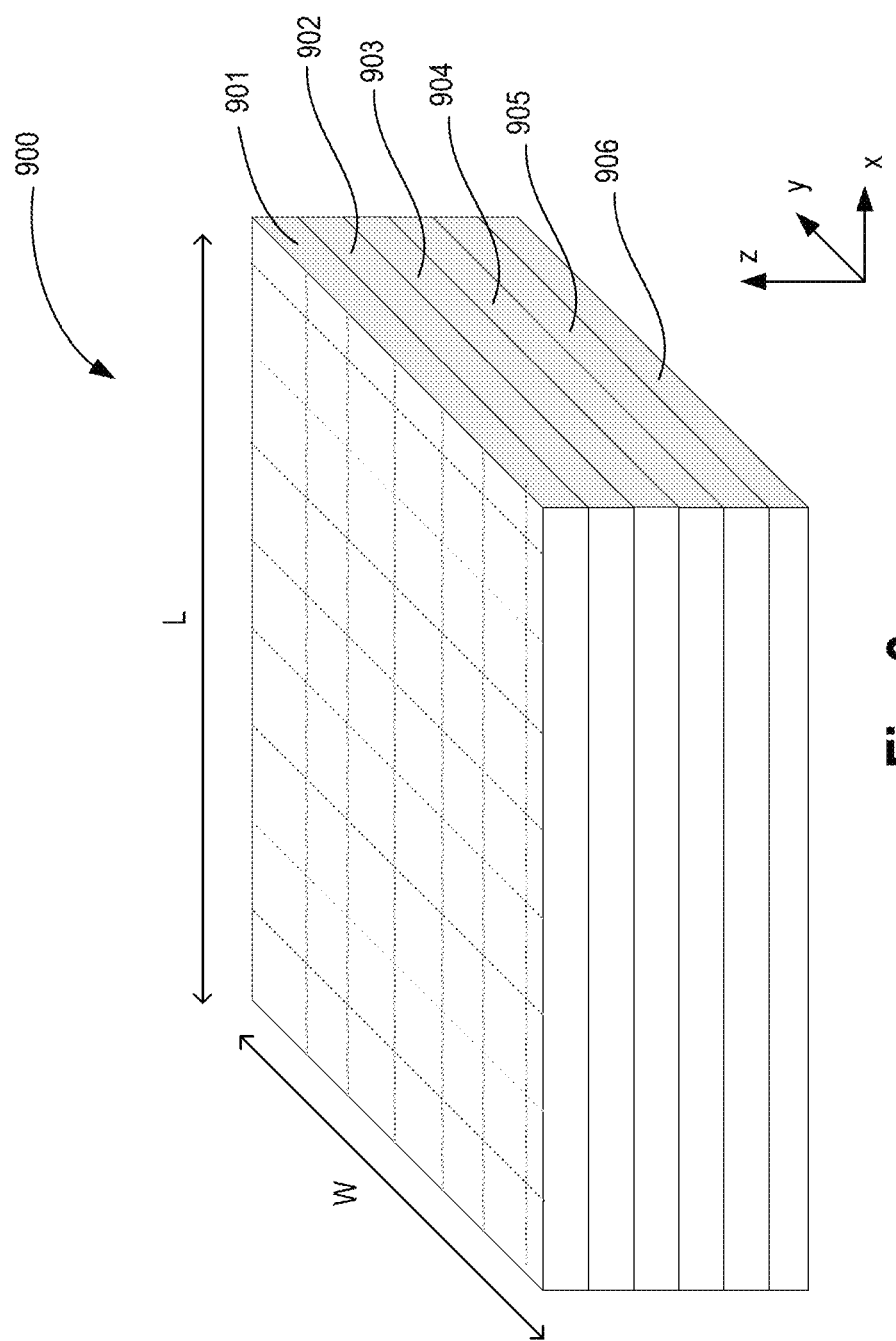
FIG. 9 illustrates an apparatus which includes a power plane comprising a supercapacitor including improper FE, according to some embodiments of the disclosure.

FIG. 9 illustrates apparatus 900 which includes a power plane comprising a supercapacitor including improper FE, according to some embodiments of the disclosure. In some embodiments, apparatus 900 includes power plane 901, dielectric layer 902, layer of magnetic memory 903, dielectric layer 904, ground or sink layer 905. Traditional frontend layer 906 comprises an active region (e.g., a region where a transistor is formed). In some embodiments, power plane 901 provides capacitance such that current or charge delivered by the capacitance is out-of-plane (e.g., perpendicular to the plane of apparatus 900). In some embodiments, by delivering current or charge out-of-plane, high series resistance is avoided in patterned wires (e.g., mesh of wires of power plane 901 shown as dotted lines). In some embodiments, power plane 901 comprises a supercapacitor including improper FE material.

In some embodiments, power plane 901 is disposed "on" or "over" dielectric layer 902 (e.g., oxide). In some embodiments, a beyond CMOS device layer 903 (e.g., layer comprising spin layer, magnetic logic, magnetic memory, magnetic junction (e.g., spin valve or magnetic tunneling junction), all spin logic (ASL), etc.). In some embodiments, beyond CMOS device layer 903 is adjacent to dielectric layer 904. In some embodiments, dielectric layer 904 is adjacent to a ground plane 905. In some embodiments, ground plane 905 is coupled to layer 906 which includes traditional fabricating layers (e.g., layers used in a CMOS process). In some embodiments, the length 'L' and width 'W' of power plane 901 is 1 centimeter (cm) each resulting in a 100 mm² area plane which is large enough to provide power to a low voltage device beyond CMOS device formed in layer 903. While FIG. 9 shows layer 901 above layer 903 other orientations are possible. For instance, layer 903 can be above layer 901 or beside layer 901 (e.g., rotating apparatus 900 by 180 or 90 degrees respectively).

Figure 10:
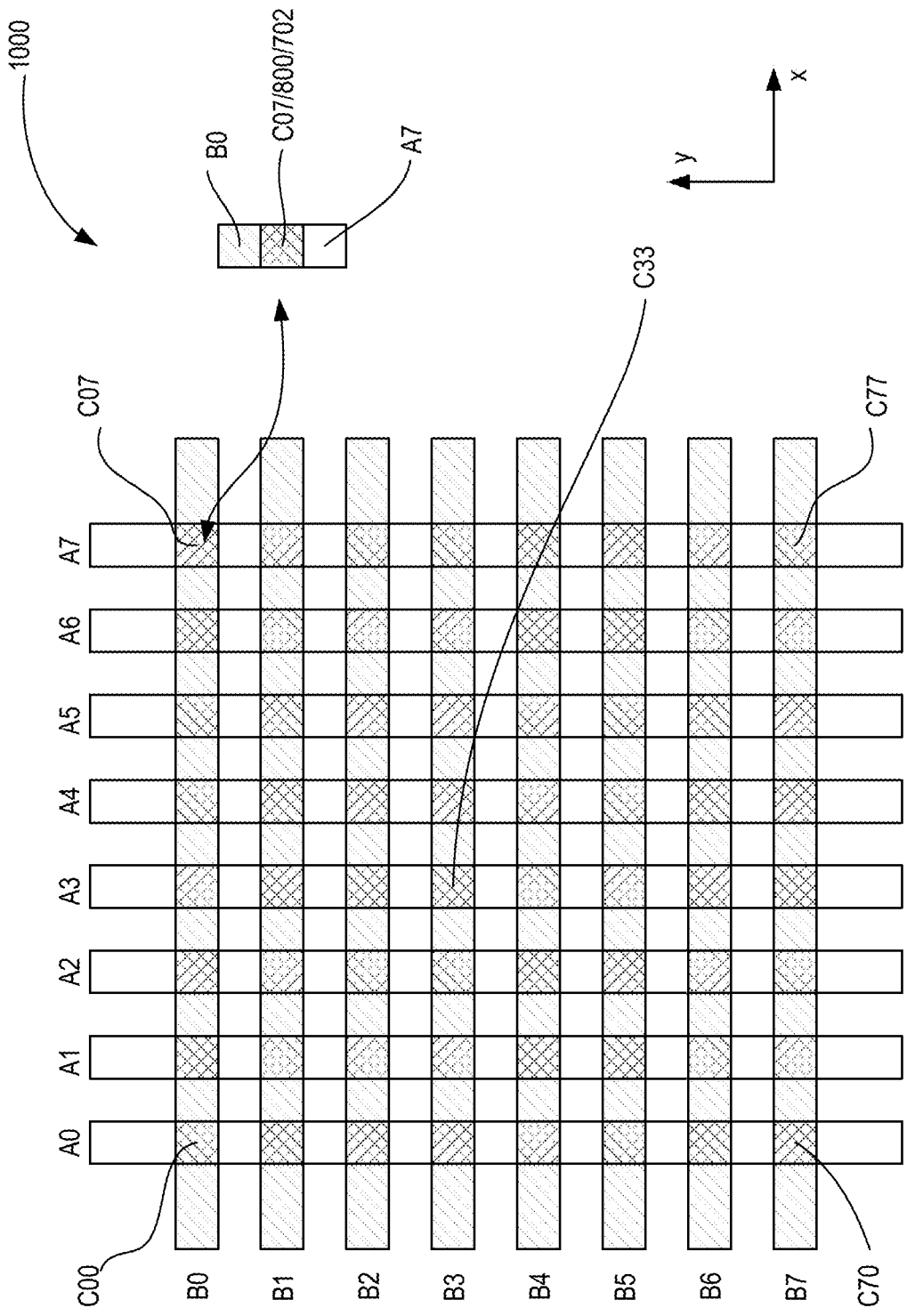
FIG. 10 illustrates an apparatus showing distributed metal-insulator-metal (MIM) capacitors comprising supercapacitors having improper FE, according to some embodiments of the disclosure.

FIG. 10 illustrates an apparatus 1000 showing distributed metal-insulator-metal (MIM) capacitors comprising supercapacitors having improper FE, according to some embodiments of the disclosure.

Apparatus 1000 illustrates a mesh of two layers with supercapacitor having improper FE formed between the two layers. Here the first layer is layer B having parallel lines B0 through B7, and the second layer is layer A having parallel lines A0 through A7, where lines A0 through A7 are orthogonal to lines B0 through B7. In this example, 8 lines of layers A and B are shown. However, the distributed capacitor of various embodiments can be formed with any number of lines of layers A and B.

In some embodiments, the first layer B with lines B0 through B7 is coupled to a power supply, thus forming power supply lines. In some embodiments, the second layer A with lines A0 through A7 is coupled to a ground supply, thus forming ground supply lines. The array of supercapacitors with improper FE here forms a distributed network of parallel capacitors, in accordance with some embodiments. In some embodiments, supercapacitors C00 through C77 (not all are labeled for sake of brevity) are formed between the regions of lines A0 through A7 and B0 through B7. In some embodiments, the supercapacitors comprise one of capacitor 702 or 800 (shown as a cross-section).

In some embodiments, the array of supercapacitors C00 through C77 is used for charge storage and switching in backend of a computing chip. In some embodiments, the array of supercapacitors C00 through C77 is integrated with low voltage logic and is used to provide power to it. In some embodiments, the array of supercapacitors C00 through C77 provides power to frontend transistors (e.g., CMOS transistors).

Figure 11A:
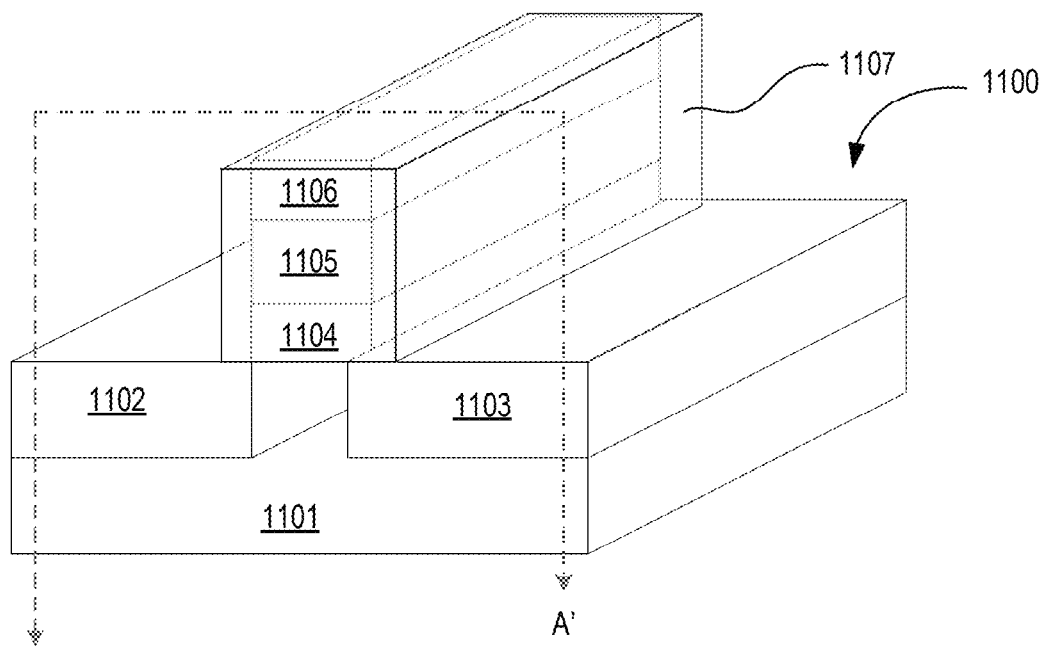
FIGS. 11A-B illustrate a planar field effect transistor (FET) and a FinFET, respectively, comprising improper FE in the gate stack, in accordance with some embodiments.
Figure 11B:
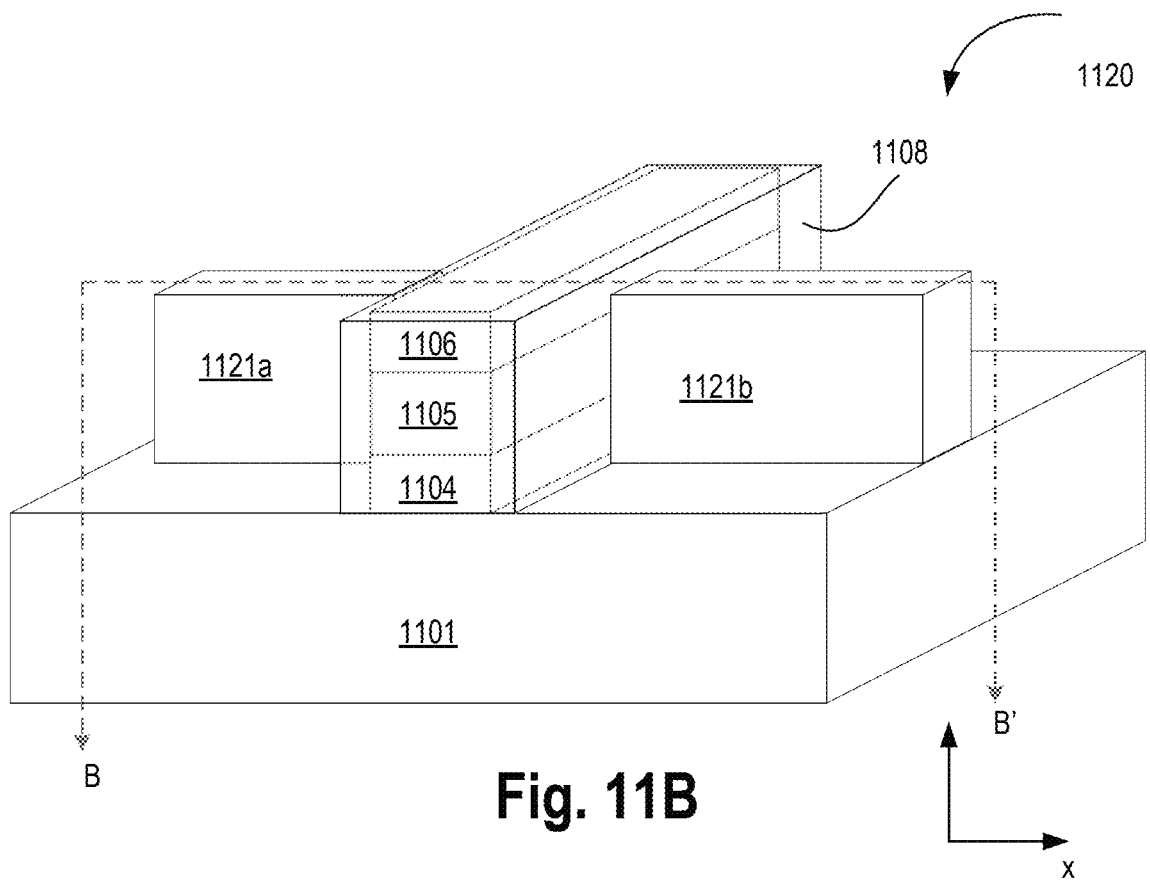

FIGS. 11A-B illustrate a planar field effect transistor (FET) 1100 and a FinFET 1120, respectively, comprising improper FE in the gate stack, in accordance with some embodiments. In some embodiments, when the gate stack of a planar FET 1100 is being formed, improper FE material is embedded between a dielectric and the gate electrode.

Planar FET 1100 comprises substrate 1101, doped regions 1102 and 1103 forming source and drain regions, a gate stack comprising dielectric 1104, improper FE structure 1105, and gate metal layer 1106; and spacers 1107.

In some embodiments, the substrate 1101 includes a suitable semiconductor material such as but not limited to, single crystal silicon, polycrystalline silicon and silicon on insulator (SOD). In another embodiment, the substrate 1101 includes other semiconductor materials such as germanium, silicon germanium, or a suitable group III-V or group III-N compound. The substrate 1101 may also include semiconductor materials, metals, dopants, and other materials commonly found in semiconductor substrates.

The gate dielectric layer 1104 may include one layer or a stack of layers. The one or more layers may include silicon oxide, silicon dioxide (Sift) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1104 to improve its quality when a high-k material is used. The thickness of the dielectric layer 1104 in the z-direction is in the range of 0.1 nm to 1 nm.

In some embodiments, improper FE material 1105 is deposited over gate dielectric 1106. In some embodiments, improper FE material includes one or more of: super lattice of $PbTiO_3$ and $SrTiO_3$; super lattice of $SrZrO_3$ and $BaZrO_3$; $Ca_3B_2O_7$, where B is one of Mn or Ti or both; $St_3B_2O_7$, where B is one of Mn or Ti or both; $NaRTiO_4$, where R is one of Y, La, Na, Sm—Ho; super lattice $YFeO_3$ and $YTiO_3$. The thickness of the improper FE material 1105 along the z-direction is in the range of 3 nm to 10 nm.

In some embodiments, the gate metal layer 1106 may be comprised of at least one P-type work-function metal or N-type work-function metal, depending on whether the transistor is to be a PMOS or an NMOS transistor. In some embodiments, the gate metal layer 1106 may be comprised of a stack of two or more metal layers, where one or more metal layers are work-function metal layers and at least one metal layer is a conductive fill layer. The thickness for the gate metal layer 1106 in the z-direction is in a range of 10 nm to 20 nm.

For a PMOS transistor, metals that may be used for the gate metal layer 1106 include, but are not limited to, ruthenium, palladium, platinum, cobalt, nickel, and conductive metal oxides, e.g., ruthenium oxide. A P-type metal layer will enable the formation of a PMOS gate metal layer 1106 with a work-function that is between about 4.9 eV and about 5.2 eV. For an NMOS transistor, metals that may be used for the gate metal layer 1106 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate metal layer 1106 with a work-function that is between about 3.9 eV and about 4.2 eV.

In some embodiments, the gate metal layer 1106 may be comprised of a "U"-shaped structure that includes a bottom portion substantially parallel to the surface of the substrate and two sidewall portions that are substantially perpendicular to the top surface of the substrate. In another embodiment, at least one of the metal layers that form the gate metal layer 1106 may simply be a planar layer that is substantially parallel to the top surface of the substrate and does not include sidewall portions substantially perpendicular to the top surface of the substrate. In some embodiments of the present disclosure, the gate metal layer 1106 may be comprised of a combination of U-shaped structures and planar, non-U-shaped structures. For example, the gate metal layer 1106 may be comprised of one or more U-shaped metal layers formed atop one or more planar, non-U-shaped layers.

In some embodiments, a pair of spacer layers (sidewall spacers) 1106 may be formed on opposing sides of the gate stack that bracket the gate stack. The pair of spacer layers 1108 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 1102 and drain region 1103 are formed within the substrate 1101 adjacent to the gate stack of the transistor. The source region 1102 and drain region 1103 are generally formed using either an implantation/diffusion process or an etching/deposition process. In the former process, dopants such as boron, aluminum, antimony, phosphorous, or arsenic may be ion-implanted into the substrate to form the source region 1102 and drain region 1103. An annealing process that activates the dopants and causes them to diffuse further into the substrate typically follows the ion-implantation process. In the latter process, the substrate may first be etched to form recesses at the locations of the source and drain regions. An epitaxial deposition process may then be carried out to fill the recesses with material that is used to fabricate the source region 1102 and drain region 1103. In some embodiments, the source region 1102 and drain region 1103 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 1102 and drain region 1103 may be formed using one or more alternate semiconductor materials such as germanium or a suitable group III-V compound. In some embodiments, one or more layers of metal and/or metal alloys may be used to form the source region 1102 and drain region 1103.

Materials for FinFET 1120 are similar to those of planar FET 1100. The fins 1121a and 1121b form the source and drain regions, respectively, and may have similar materials as source and drain regions 1102 and 1103, respectively. The embodiments are not limited to planar and Fin FETs, and are also applicable to other type of transistors such as nanowires.

Figure 12A:
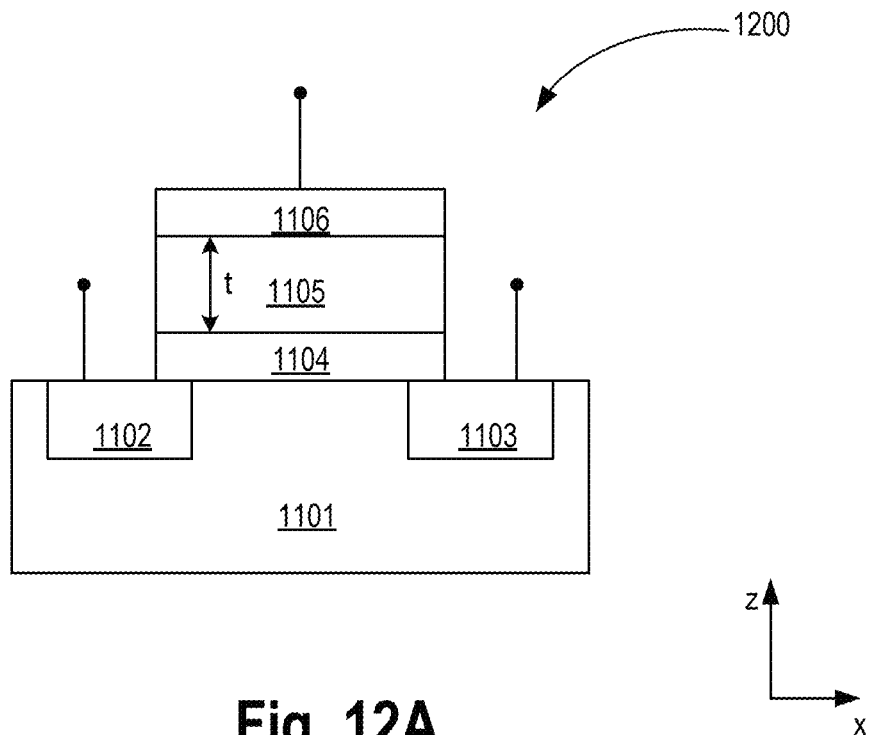
FIGS. 12A-B illustrate cross-sections of the planar FET and FinFET of FIGS. 11A-B, respectively, according to some embodiments of the disclosure.
Figure 12B:
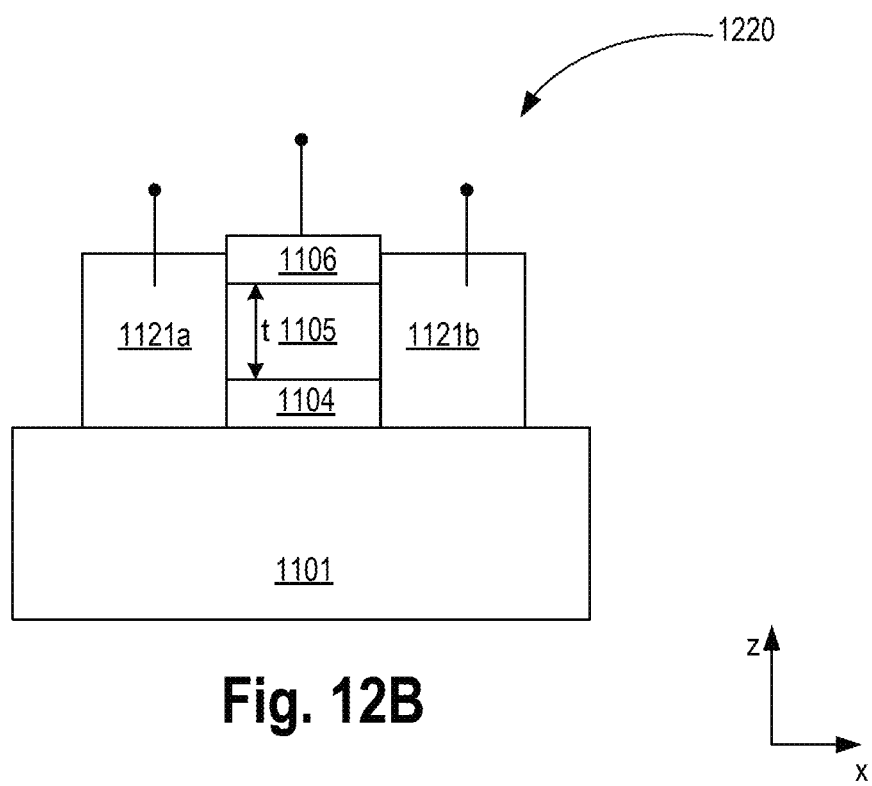

FIGS. 12A-B illustrate cross-sections 1200 and 1220 of the planar FET and FinFET of FIGS. 11A-B, respectively, according to some embodiments of the disclosure.

FIGS. 13A-B illustrate apparatuses 1300 and 1350 for switch mode power supply during charging and discharging modes, respectively, according to some embodiments of the disclosure.

FIG. 13A depicts a charge mode configuration in a SMPS (switch mode power supply) and FIG. 13B depicts a discharge mode configuration in the power supply, in accordance with some embodiments. Elements 1340, 1341, 1342 represent capacitance (e.g., parasitic capacitance) between layers within the chip, in accordance with some embodiments. In some embodiments, capacitors 1310, 1311, 1312 correspond to improper FE capacitors C00, C01, C02, etc., in accordance with some embodiments. In some embodiments, capacitors 1340, 1341, 1342 and onwards are coupled to power and ground lines of a beyond CMOS device 1301 (e.g., spin logic operating on a 10 mV supply). In some embodiments, during the SMPS charging mode, capacitors 1310, 1311, 1312 are charged in series. As shown in configuration 1350, switching mechanisms (e.g., circuits) may be configured to convert the SMPS from a series to a parallel connection when switching from charge mode to discharge mode, in which capacitors 1310, 1311, 1312 are discharged in parallel.

The series configured charge mode provides for large voltage division and current multiplication, in accordance with some embodiments. For example, a 1 V power supply applied to charge configuration 1300 may be divided down over 100 capacitors to provide 10 mV per capacitor. In place of the charging current of, for example, 1 A (Amperes), each of the capacitors supplies a discharge current of 1 A to create the total current of 100 A over the chip. In some embodiments, the parallel configured discharge mode enables ultra-low series resistance as power need not traverse extended paths and instead deploys out-of-plane directly to a logic device.

In some embodiments, the SMPS includes a charging cycle at, for example, 1 KHz-10 MHz where a bank of improper FE capacitors is coupled in series to charge to 1 V (FIG. 13A). In some embodiments, the SMPS includes a discharge cycle at 1 KHz-10 MHz where the capacitors (e.g., each at 10 mV) are discharged in parallel into the device layer. In some embodiments, in order to ensure an uninterrupted power supply, a part of the on-chip capacitors (e.g., C00 through C07) can be in charge mode, while a part of the capacitors (e.g., C10 through C17) can be in discharge mode. Then the SMPS is switched, and charge and discharge modes are reversed.

FIGS. 13A-B illustrate how an entire SMPS is located on a chip along with spin logic devices, spintronic memory, and the like. While the SMPS may cooperate with a battery located off chip, the SMPS itself is located on the chip, in accordance with some embodiments.

Figure 14:
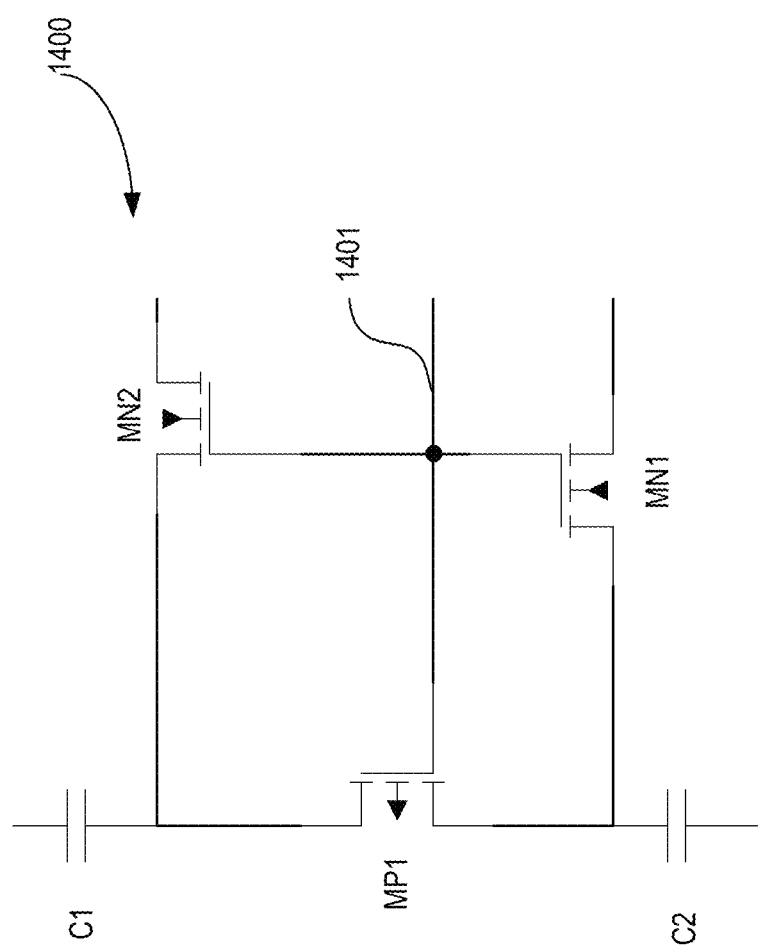
FIG. 14 illustrates a 4-terminal controlled switch for the power plane, according to some embodiments of the disclosure.

FIG. 14 illustrates a 4-terminal controlled switch 1400 for the power plane, according to some embodiments of the disclosure.

In some embodiments, the 4-terminal controlled switch comprises p-type transistor MP1, n-type transistors MN1 and MN2, and improper FE capacitors C1 and C2 coupled together as shown. The transistors can be the improper FE transistors as those described with reference to FIGS. 11-12. In some embodiments, the gate terminals of transistors MP1, MN1, and MN2 are coupled to node 1401 which provides a switching signal. In some embodiments, capacitors C1 and C2 are according to any one of capacitors 200 or 702.

In some examples, the switching element is part of a SMPS embodiment for converting a 1V, 1 A supply to a 10 mV, 100 A supply. In some embodiments, transistor MP1 is operative during a clock phase and transistors MN2 and MN2 are operative in an opposite SMPS clock phase.

Some embodiments include the following capacitance per unit area characteristics to enable a low resistance, low power supply that is operative with beyond CMOS devices (e.g., spin logic devices).

In some embodiments, the total charge (Q) required for a chip having an area A=1 mm² with a $P_d$=1 W/cm² power requirement at the spin logic voltage $V_{SL}$=0.01 V and SMPS switching frequency is 10 MHz is:

$$Q = \frac{P_d A T_{smps}}{V_{SL}} = 10^{-7} C,$$

where $T_{smps}$ is the period (inverse frequency) of SMPS switching.

The effective capacitance per unit area at a voltage 0.01 V is thus:

$$C_d = \frac{P_d T_{smps}}{V_{SL}^2} = 10^{-3} F/cm^2.$$

The required effective capacitance value corresponds to normal capacitance with 10 nm dielectric thickness. An embodiment has a constraint on the dielectric constant, at a dielectric thickness d=10 nm, of:

$$\varepsilon > \frac{C_d d}{\varepsilon_0} = 1.1$$

This is one option for a dielectric constant. A higher dielectric constant will help relax the requirement for the thickness of the layers, requirement on the area occupied by capacitors, or increase the performance of the power plane.

Some embodiments include a fill factor for the power plane at a given dielectric constant, where the fill factor of the power plane is the total area of the power plane used for the MIM capacitors divided by the chip area. Fill factor for the power plane is given by:

$$F = \frac{C_d d}{\varepsilon \varepsilon_0}$$

Hence, the fill factors of the supply plane will leave sufficient space for reuse of the metal layer for regular routing or for via dropping.

Some embodiments include a series resistance whereby series resistance seen by the logic device layer is the source resistance of the SMPS at the output. At a fill factor of 10% the series resistance of the via layer per unit chip area is (via resistivity is assumed 10 times copper resistivity):

$$R_s = \frac{\rho L}{FA} \sim 1.6 \times 10^{-12} \Omega/cm^2,$$

where L is length of the via

The effective series resistance voltage drop over the vias is 0.16 nV (which is small compared to the 10 mV supply). At a voltage drop of $V_{drop}$=1 mV, the required total conductance of the switches per unit chip area:

$$G_{total} = 3 \frac{P_d}{V_{SL} V_{drop}} = 3 \times 10^5/(\Omega \cdot cm^2)$$

The power switching transistors (e.g., transistors MP1, MN1, and MN2) are operated at a low resistance region, below the supply voltage \Tad, where the resistance per unit length of the transistors is less than:

$$G_{STV} = 5 \frac{I_{dsat}}{V_{dd}} = 1.4 \times 10^4/(\Omega m),$$

where $I_{dsat}$ is taken from the 2011 edition of the International Technology Roadmap for Semiconductors.

In some embodiments, the total conductance of $G_{total}$ requires a gate length per unit area of the chip to be:

$$L_{gtotal} = \frac{G_{total}}{G_{STV}} = \frac{3P_d V_{ds}}{5V_{SL}V_{drop}I_{sat}} = 21 m/cm^2$$

Some embodiments may use a total power transistor gate length of 21 meters to power a 100 mm² chip at 1 W/cm² power budget.

In an embodiment the fraction of area of the power transistors (e.g., transistors MP1, MN1, and MN2) is:

$$F_{Ptran} = 4FL_{gtotal} = \frac{12FP_d V_{ds}}{5V_{SL}V_{drop}I_{sat}} = 2.52\%$$

Hence, the area overhead for power gating and conversion is less than 3%.

In an embodiment, power conversion losses in the SMPS (output delivered power of the SMPS as a fraction of the input power) is as follows:

$$P_{loss} = I_{on}V_{drop} + \frac{C_{Gtotal}V_g^2}{T_{smps}}$$

Or in other words:

$$P_{loss} = \frac{P_d A}{V_{SL}}V_{drop} + \frac{3P_d V_{ds}V_g^2}{5V_{SL}V_{drop}I_{sat}T_{smps}} = 0.141 W/cm^2$$

and power efficiency of the SMPS is given by:

$$\eta_{SMPS} = 1 - \frac{P_{loss}}{P_d} = \frac{A}{V_{SL}}V_{drop} + \frac{3V_{ds}V_g^2}{5V_{SL}V_{drop}I_{sat}T_{smps}} = 85.88\%$$

Thus, an embodiment has a power conversion efficiency of 85.88% with an aerial overhead of 2.5% (for a high-k dielectric), on state drop of 1 mV, area fill factor of the power plane of 25%, and current density of 400 A/cm². The series resistance drop is less than 1 nV, thereby avoiding the interconnect losses as outlined in a traditional voltage network.

Figure 15:
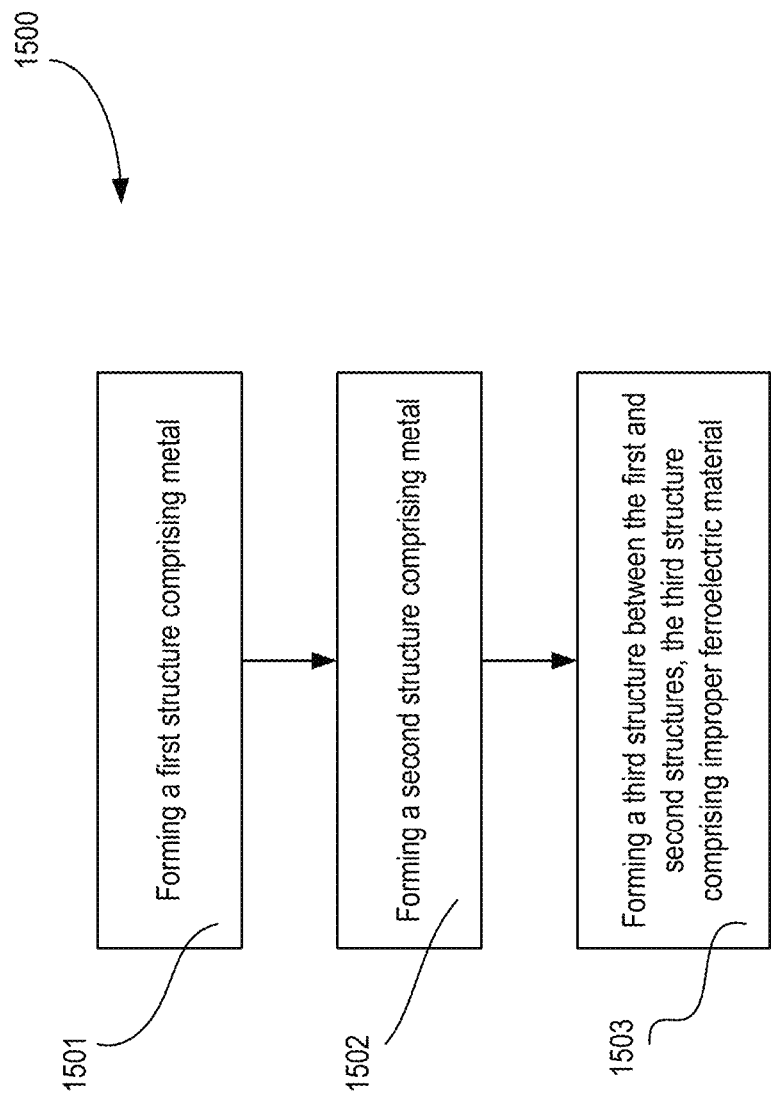
FIG. 15 illustrates a flowchart for forming an improper FE capacitor, in accordance with some embodiments.

FIG. 15 illustrates a flowchart 1500 for forming an improper FE capacitor, in accordance with some embodiments. While the following blocks (or process operations) in the flowchart are arranged in a certain order, the order can be changed. In some embodiments, some blocks can be executed in parallel.

At block 1501, a first structure is formed which comprises metal. At block 1502, a second structure is formed comprising metal. At block 1503, a third structure is formed between the first and second structures, wherein the third structure comprises an improper ferroelectric material. In some embodiments, the improper ferroelectric material comprises one or more of: Pb, Ti, Sr, Zr, Ba, Ca, Mn, Na Y, La, Sm, or Fe. In some embodiments, the improper ferroelectric material comprises a super lattice of: PbTiO₃ (PTO) and SrTiO₃ (STO); SrZrO₃ and BaZrO₃; or FeO₃ and YTiO₃. In some embodiments, the super lattice of PTO and STO are repeated in a range of 2 to 100 times. In some embodiments, the improper ferroelectric material has a thickness less than or equal to 50 nm. In some embodiments, the metal of the first or second structures comprises Ti or N.

Figure 16:
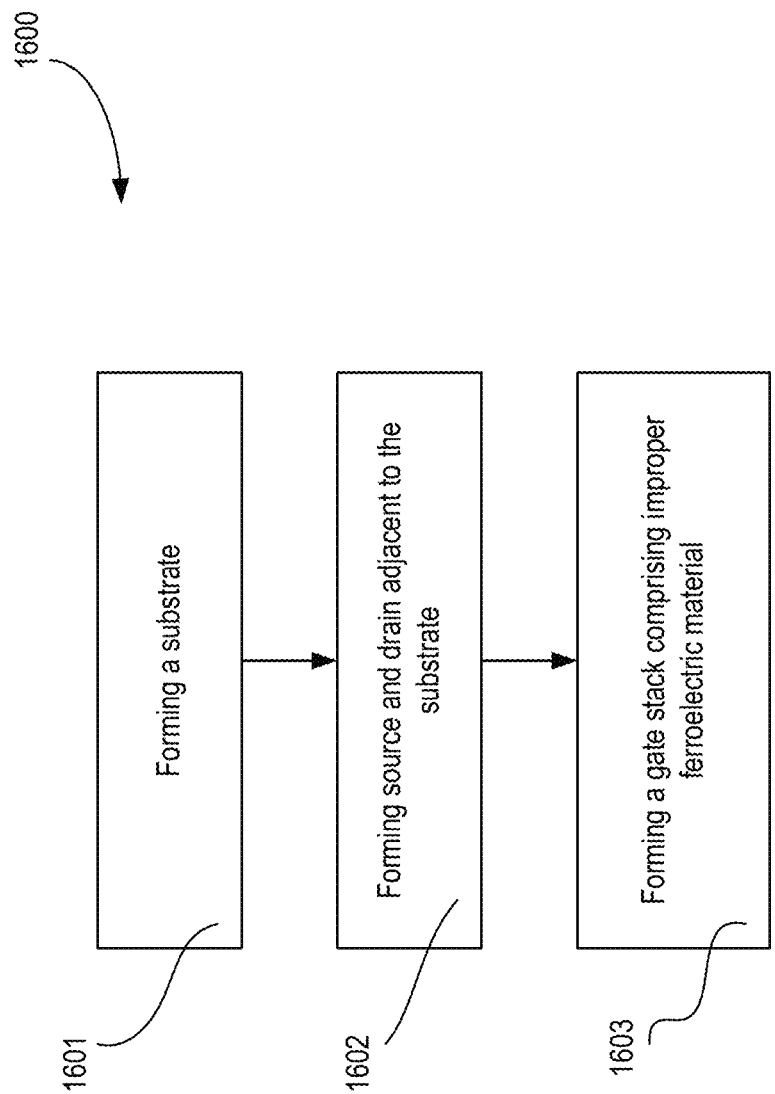
FIG. 16 illustrates a flowchart for forming a transistor having improper FE in the gate stack, in accordance with some embodiments.

FIG. 16 illustrates a flowchart 1600 for forming a transistor having improper FE in the gate stack, in accordance with some embodiments. While the following blocks (or process operations) in the flowchart are arranged in a certain order, the order can be changed. In some embodiments, some blocks can be executed in parallel.

At block 1601, a substrate is formed. At block 1602, source and drain are formed adjacent to the substrate. At block 1603, a gate stack is formed which comprises improper ferroelectric material. In some embodiments, the gate stack includes: a dielectric; a first structure comprising the improper ferroelectric material, wherein the first structure is adjacent to the dielectric; and a second structure comprising metal, wherein the second structure is adjacent to the first structure. In some embodiments, the dielectric has a thickness in a range of 0.1 nm to 1 nm. In some embodiments, the first structure has a thickness in a range of 3 nm to 10 nm. In some embodiments, in the second structure has a thickness in a range of 10 nm to 20 nm. In some embodiments, the metal of the second structure includes Ti or N. In some embodiments, the improper ferroelectric material comprises one or more of: Pb, Ti, Sr, Zr, Ba, Ca, Mn, Na Y, La, Sm, or Fe. In some embodiments, the improper ferroelectric material comprises a super lattice of: PbTiO₃ (PTO) and SrTiO₃ (STO); SrZrO₃ and BaZrO₃; or FeO₃ and YTiO₃.

Figure 17:
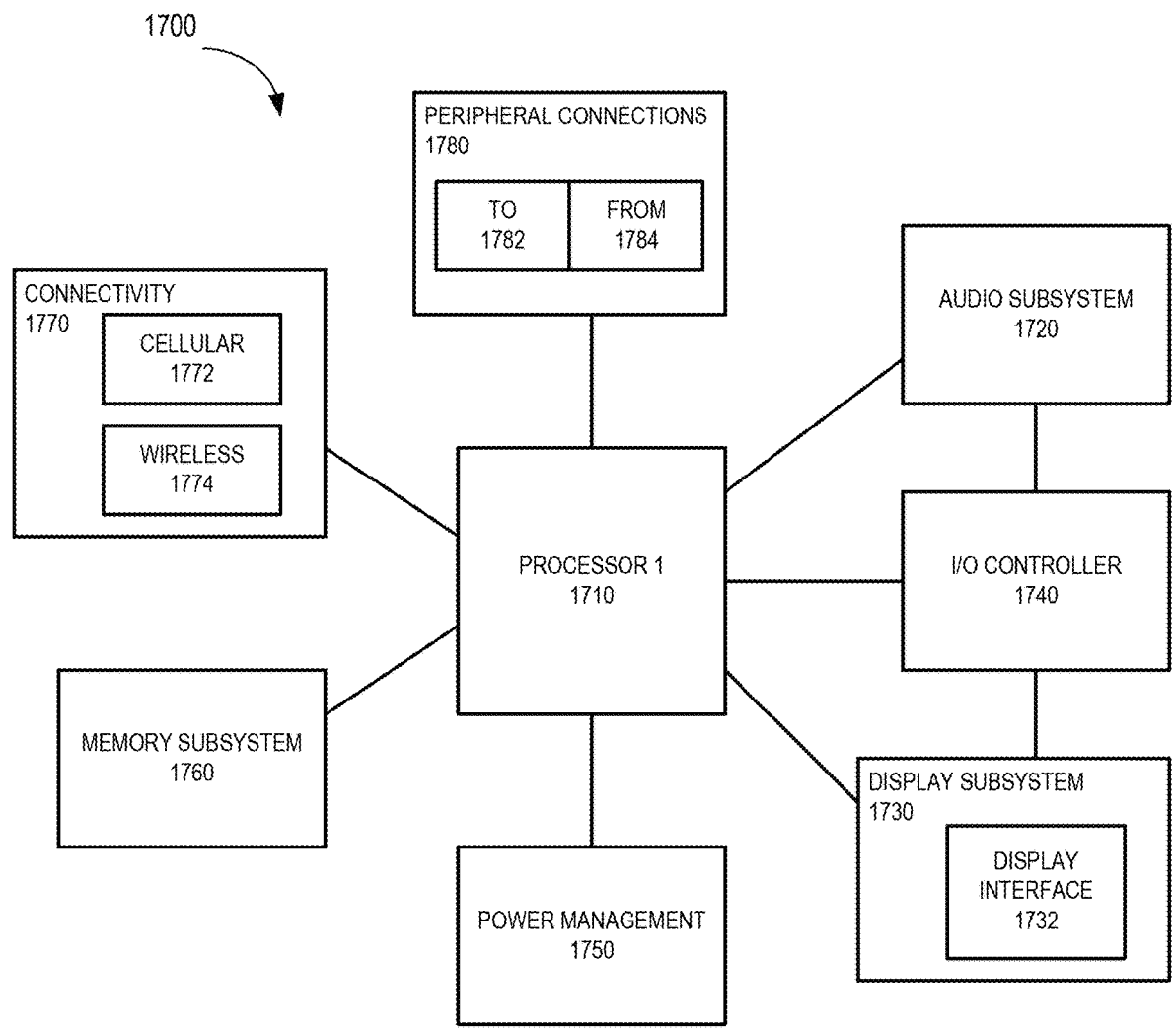
FIG. 17 illustrates a smart device or a computer system or a SoC (System-on-Chip) with an improper FE capacitor and/or transistor having improper FE capacitor, according to some embodiments of the disclosure.

FIG. 17 illustrates a smart device or a computer system or a SoC (System-on-Chip) with an improper FE capacitor and/or transistor having improper FE capacitor, according to some embodiments of the disclosure. FIG. 17 illustrates a block diagram of an embodiment of a mobile device in which flat surface interface connectors could be used. In some embodiments, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In some embodiments, computing device 1700 includes first processor 1710 with an improper FE capacitor and/or transistor having improper FE material, according to some embodiments discussed. Other blocks of the computing device 1700 may also include improper FE capacitor and/or transistor having improper FE material, according to some embodiments. The various embodiments of the present disclosure may also comprise a network interface within 1770 such as a wireless interface so that a system embodiment may be incorporated into a wireless device, for example, cell phone or personal digital assistant.

In some embodiments, processor 1710 can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In some embodiments, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

In some embodiments, computing device 1700 comprises display subsystem 1730. Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

In some embodiments, computing device 1700 comprises I/O controller 1740. I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In some embodiments, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In some embodiments, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1700 comprises connectivity 1770. Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1700 comprises peripheral connections 1780. Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first structure comprising metal;
a second structure comprising metal; and
a third structure between the first and second structures, wherein the third structure comprises an improper ferroelectric material comprising a super lattice of:
$PbTiO_3$ (PTO) and $SrTiO_3$ (STO);
$SrZrO_3$ and $BaZrO_3$; or
$FeO_3$ and $YTiO_3$.

2. The apparatus of claim 1, wherein material layers of the super lattice of PTO and STO are repeated in a range of 2 to 100 times.

3. The apparatus of claim 1, wherein the metal of the first or second structures comprises Ti or N.

4. A field effect transistor (FET) comprising:
a substrate;
a source and drain adjacent to the substrate; and
a gate stack between the source and drain, wherein the gate stack includes:
a dielectric;
a first structure comprising improper ferroelectric material, wherein the first structure is adjacent to the dielectric; and
a second structure comprising metal, wherein the second structure is adjacent to the first structure.

5. The FET of claim 4, wherein the dielectric has a thickness in a range of 0.1 nm to 1 nm.

6. The FET of claim 4, wherein the first structure has a thickness in a range of 3 nm to 10 nm.

7. The FET of claim 4, wherein the second structure has a thickness in a range of 10 nm to 20 nm.

8. The FET of claim 4, wherein the metal of the second structure includes: Ti, N, W, Ta, or Cu.

9. The FET of claim 4, wherein the improper ferroelectric material comprises one or more of: Pb, Ti, Sr, Zr, Ba, Ca, Mn, Na, Y, La, Sm, or Fe.

10. The FET of claim 4, wherein the improper ferroelectric material comprises a super lattice of:
$PbTiO_3$ (PTO) and $SrTiO_3$ (STO) $SrZrO_3$ and $BaZrO_3$; or
$FeO_3$ and $YTiO_3$.

11. A system comprising:
a memory;
a processor coupled to the memory, the processor including a transistor which comprises:
a substrate;
a source and drain adjacent to the substrate; and
a gate stack between the source and drain, wherein the gate stack includes:
a dielectric;
a first structure comprising improper ferroelectric material,
wherein the first structure is adjacent to the dielectric; and
a second structure comprising metal, wherein the second structure is adjacent to the first structure; and
a wireless interface to allow the processor to communicate with another device.

12. The system of claim 11, wherein the dielectric has a thickness in a range of 0.1 nm to 1 nm.

13. The system of claim 11, wherein the first structure has a thickness in a range of 3 nm to 10 nm.

14. The system of claim 11, wherein the second structure has a thickness in a range of 10 nm to 20 nm.

15. The system of claim 11, wherein the metal of the second structure includes Ti, N, W, Ta, or Cu.

16. The system of claim 11, wherein the improper ferroelectric material comprises one or more of: Pb, Ti, Sr, Zr, Ba, Ca, Mn, Na, Y, La, Sm, or Fe.

17. The system of claim 11, wherein the improper ferroelectric material comprises a super lattice of:
$PbTiO_3$ (PTO) and $SrTiO_3$ (STO) $SrZrO_3$ and $BaZrO_3$; or
$FeO_3$ and $YTiO_3$.

18. The apparatus of claim 1, wherein the improper ferroelectric material has a thickness less than or equal to 50 nm.

\* \* \* \* \*